(12) United States Patent
Aoki et al.

(10) Patent No.: US 10,910,746 B2
(45) Date of Patent: Feb. 2, 2021

(54) MEMORY AND POWER MEZZANINE CONNECTORS

(71) Applicant: Intel Corporation, Santa Clara, CA (US)

(72) Inventors: Russell Aoki, Tacoma, WA (US); Aaron Gorius, Upton, MA (US); Michael T. Crocker, Portland, OR (US); Matthew J. Adiletta, Bolton, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/208,543

(22) Filed: Dec. 3, 2018

(65) Prior Publication Data

US 2019/0173211 A1 Jun. 6, 2019

Related U.S. Application Data

(60) Provisional application No. 62/593,693, filed on Dec. 1, 2017.

(51) Int. Cl.
| | |
|---|---|
| *H01R 12/00* | (2006.01) |
| *H01R 12/72* | (2011.01) |
| *H05K 1/14* | (2006.01) |
| *G06F 1/18* | (2006.01) |
| *H05K 7/18* | (2006.01) |

(52) U.S. Cl.
CPC ........... *H01R 12/721* (2013.01); *G06F 1/185* (2013.01); *H05K 1/141* (2013.01); *H05K 7/18* (2013.01); *H05K 2201/10159* (2013.01)

(58) Field of Classification Search
CPC .. H01R 23/722; H05K 7/1084; H05K 7/1069; H05K 1/141; G01R 31/2887; G01R 1/0483
USPC ............ 439/66, 70, 71; 324/756.01, 756.02; 361/803
See application file for complete search history.

(56) References Cited

U.S. PATENT DOCUMENTS

| | | | | |
|---|---|---|---|---|
| 4,954,878 A | * | 9/1990 | Fox ..................... | H01L 23/4006 257/675 |
| 5,307,012 A | * | 4/1994 | Bhattacharyya ..... | G01R 1/0433 324/750.25 |
| 5,477,130 A | * | 12/1995 | Hashimoto ............ | H01M 2/34 429/92 |
| 5,929,646 A | * | 7/1999 | Patel ................... | G01R 1/07378 324/756.04 |
| 6,285,558 B1 | * | 9/2001 | Frantz .................. | H01L 25/105 257/690 |
| 6,746,252 B1 | * | 6/2004 | Scott .................... | H01R 13/187 439/70 |

(Continued)

*Primary Examiner* — Thanh Tam T Le
(74) *Attorney, Agent, or Firm* — Compass IP Law PC

(57) ABSTRACT

Sleds for operation in racks of data centers are disclosed herein. A sled includes a circuit board substrate, one or more physical resources, and one or more memory devices. The circuit board substrate has a top side and a bottom side arranged opposite the top side. The one or more physical resources are coupled to the top side of the circuit board substrate. The one or more memory devices are coupled to the bottom side of the circuit board substrate. Additionally, the sled includes a connector to electrically couple the one or more physical resources to the one or more memory devices.

18 Claims, 25 Drawing Sheets

(56) References Cited

U.S. PATENT DOCUMENTS

| | | | | |
|---|---|---|---|---|
| 6,791,846 | B2* | 9/2004 | Smith | G06F 1/26 |
| | | | | 174/260 |
| 6,989,681 | B2* | 1/2006 | Maekawa | G01R 1/0483 |
| | | | | 324/754.03 |
| 7,438,557 | B1* | 10/2008 | Plucinski | H01R 13/22 |
| | | | | 439/65 |
| 7,520,753 | B1* | 4/2009 | Mulligan | G01R 1/0466 |
| | | | | 439/591 |
| 7,641,481 | B2* | 1/2010 | Trobough | H01R 13/2442 |
| | | | | 439/66 |
| 7,737,710 | B2* | 6/2010 | Cho | G01R 1/0483 |
| | | | | 257/48 |
| 7,816,929 | B2* | 10/2010 | Yamada | G01R 1/06722 |
| | | | | 324/754.07 |
| 8,018,738 | B2* | 9/2011 | Doblar | H05K 7/1061 |
| | | | | 174/260 |
| 8,277,255 | B2* | 10/2012 | Consoli | H01R 12/7076 |
| | | | | 439/620.2 |
| 8,536,889 | B2* | 9/2013 | Nelson | G01R 1/0466 |
| | | | | 324/754.01 |
| 8,550,825 | B2* | 10/2013 | Mason | G01R 1/0466 |
| | | | | 439/66 |
| 9,039,425 | B2* | 5/2015 | Mason | H01R 13/6581 |
| | | | | 439/66 |

* cited by examiner

MEMORY AND POWER MEZZANINE CONNECTORS

CROSS-REFERENCE TO RELATED APPLICATIONS

The present application claims the benefit of U.S. Provisional Patent Application No. 62/593,693, filed Dec. 1, 2017.

BACKGROUND

Typical enterprise-level data centers can include several to hundreds of racks or cabinets, with each rack/cabinet housing multiple servers. Each of the various servers of a data center may be communicatively connectable to each other via one or more local networking switches, routers, and/or other interconnecting devices, cables, and/or interfaces. The number of racks and servers of a particular data center, as well as the complexity of the design of the data center, may depend on the intended use of the data center, as well as the quality of service the data center is intended to provide.

Traditional rack systems are self-contained physical support structures that include a number of pre-defined server spaces. A corresponding server may be mounted in each pre-defined server space. Each server may include physical resources and memory devices that interface with one another. Conventional interfaces between physical resources and memory devices may complicate service of the servers and be associated with undesirable maintenance and/or repair costs.

In some data centers, each server may be embodied as a general purpose server capable of servicing different types of workloads. Of course, some servers may have different resources compared to other servers (e.g., more or fewer processor cores). In some cases, some of the servers may be special-purposed servers configured to handle specialized workloads. Each server may include various physical resources, such as processors, memory, and storage devices, depending on the functionality of the particular server. Typically such resources are secured to a printed circuit board substrate housed in

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
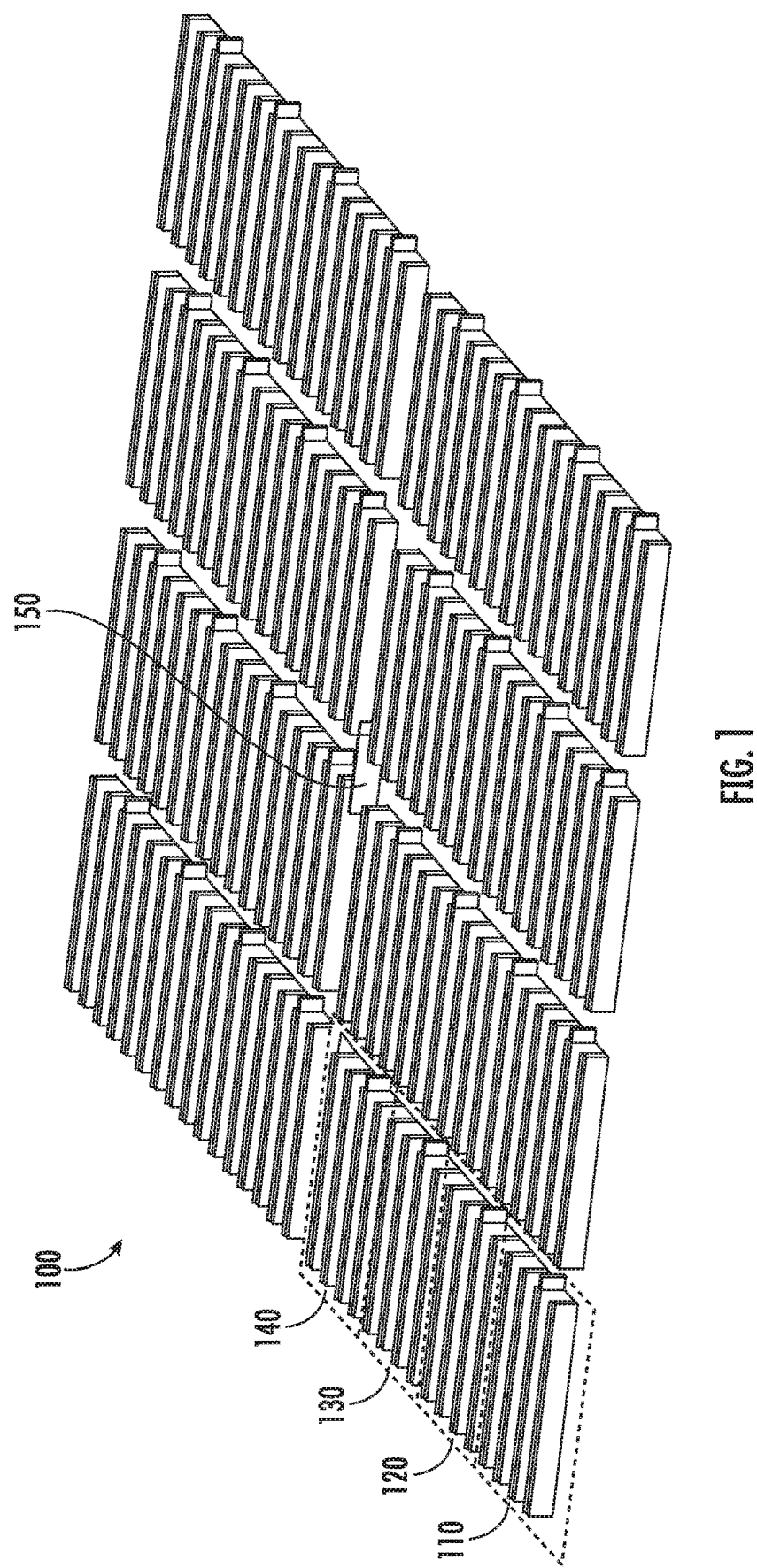
FIG. 1 is a simplified diagram of at least one embodiment of a data center for executing workloads with disaggregated resources.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a data center 100 in which disaggregated resources may cooperatively execute one or more workloads (e.g., applications on behalf of customers) includes multiple pods 110, 120, 130, 140, each of which includes one or more rows of racks. Of course, although data center 100 is shown with multiple pods, in some embodiments, the data center 100 may be embodied as a single pod. As described in more detail herein, each rack houses multiple sleds, each of which may be primarily equipped with a particular type of resource (e.g., memory devices, data storage devices, accelerator devices, general purpose processors), i.e., resources that can be logically coupled to form a composed node, which can act as, for example, a server. In the illustrative embodiment, the sleds in each pod 110, 120, 130, 140 are connected to multiple pod switches (e.g., switches that route data communications to and from sleds within the pod). The pod switches, in turn, connect with spine switches 150 that switch communications among pods (e.g., the pods 110, 120, 130, 140) in the data center 100. In some embodiments, the sleds may be connected with a fabric using Intel Omni-Path technology. In other embodiments, the sleds may be connected with other fabrics, such as InfiniBand or Ethernet. As described in more detail herein, resources within sleds in the data center 100 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 110, 120, 130, 140. As such, some resources of a single sled may be allocated to one managed node while other resources of the same sled are allocated to a different managed node (e.g., one processor assigned to one managed node and another processor of the same sled assigned to a different managed node).

A data center comprising disaggregated resources, such as data center 100, can be used in a wide variety of contexts, such as enterprise, government, cloud service provider, and communications service provider (e.g., Telco's), as well in a wide variety of sizes, from cloud service provider mega-data centers that consume over 100,000 sq. ft. to single- or multi-rack installations for use in base stations.

The disaggregation of resources to sleds comprised predominantly of a single type of resource (e.g., compute sleds comprising primarily compute resources, memory sleds containing primarily memory resources), and the selective allocation and deallocation of the disaggregated resources to form a managed node assigned to execute a workload improves the operation and resource usage of the data center 100 relative to typical data centers comprised of hyperconverged servers containing compute, memory, storage and perhaps additional resources in a single chassis. For example, because sleds predominantly contain resources of a particular type, resources of a given type can be upgraded independently of other resources. Additionally, because different resources types (processors, storage, accelerators, etc.) typically have different refresh rates, greater resource utilization and reduced total cost of ownership may be achieved. For example, a data center operator can upgrade the processors throughout their facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 2:
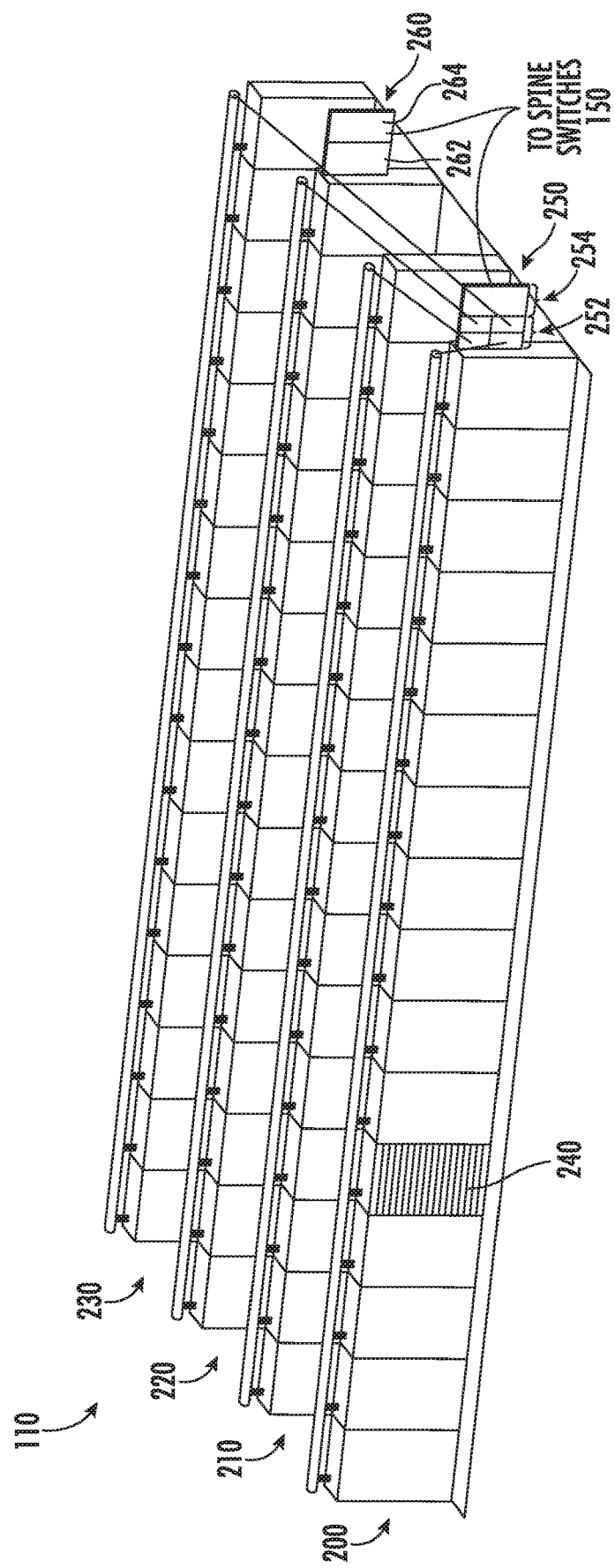
FIG. 2 is a simplified diagram of at least one embodiment of a pod that may be included in the data center of FIG. 1.

Referring now to FIG. 2, the pod 110, in the illustrative embodiment, includes a set of rows 200, 210, 220, 230 of racks 240. Each rack 240 may house multiple sleds (e.g., sixteen sleds) and provide power and data connections to the housed sleds, as described in more detail herein. In the illustrative embodiment, the racks in each row 200, 210, 220, 230 are connected to multiple pod switches 250, 260. The pod switch 250 includes a set of ports 252 to which the sleds of the racks of the pod 110 are connected and another set of ports 254 that connect the pod 110 to the spine switches 150 to provide connectivity to other pods in the data center 100. Similarly, the pod switch 260 includes a set of ports 262 to which the sleds of the racks of the pod 110 are connected and a set of ports 264 that connect the pod 110 to the spine switches 150. As such, the use of the pair of switches 250, 260 provides an amount of redundancy to the pod 110. For example, if either of the switches 250, 260 fails, the sleds in the pod 110 may still maintain data communication with the remainder of the data center 100 (e.g., sleds of other pods) through the other switch 250, 260. Furthermore, in the illustrative embodiment, the switches 150, 250, 260 may be embodied as dual-mode optical switches, capable of routing both Ethernet protocol communications carrying Internet Protocol (IP) packets and communications according to a second, high-performance link-layer protocol (e.g., Intel's Omni-Path Architecture's, InfiniBand, PCI Express) via optical signaling media of an optical fabric.

It should be appreciated that each of the other pods 120, 130, 140 (as well as any additional pods of the data center 100) may be similarly structured as, and have components similar to, the pod 110 shown in and described in regard to FIG. 2 (e.g., each pod may have rows of racks housing multiple sleds as described above). Additionally, while two pod switches 250, 260 are shown, it should be understood that in other embodiments, each pod 110, 120, 130, 140 may be connected to a different number of pod switches, providing even more failover capacity. Of course, in other embodiments, pods may be arranged differently than the rows-of-racks configuration shown in FIGS. 1-2. For example, a pod may be embodied as multiple sets of racks in which each set of racks is arranged radially, i.e., the racks are equidistant from a center switch.

Figure 3:
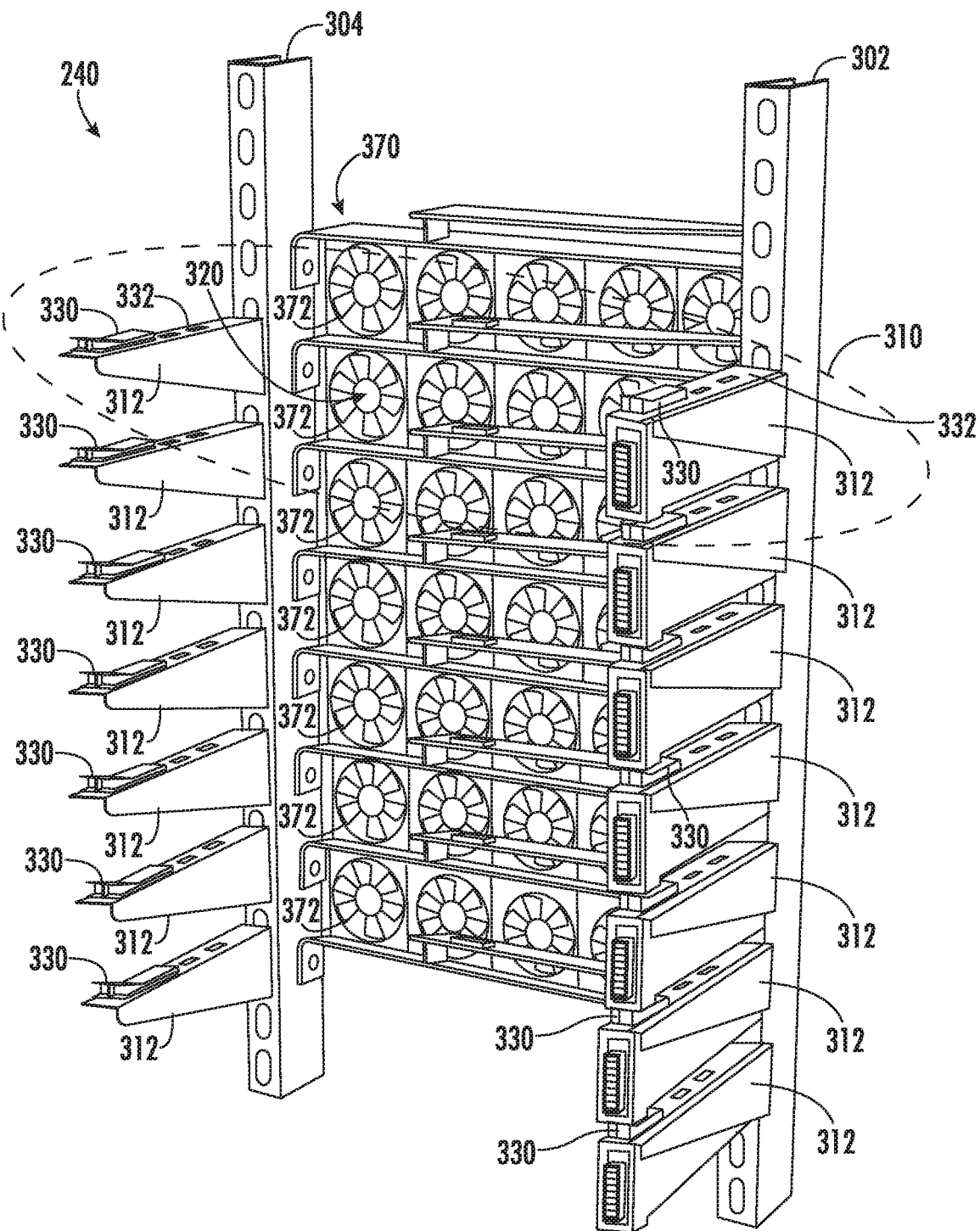
FIG. 3 is a perspective view of at least one embodiment of a rack that may be included in the pod of FIG. 2.
Figure 4:
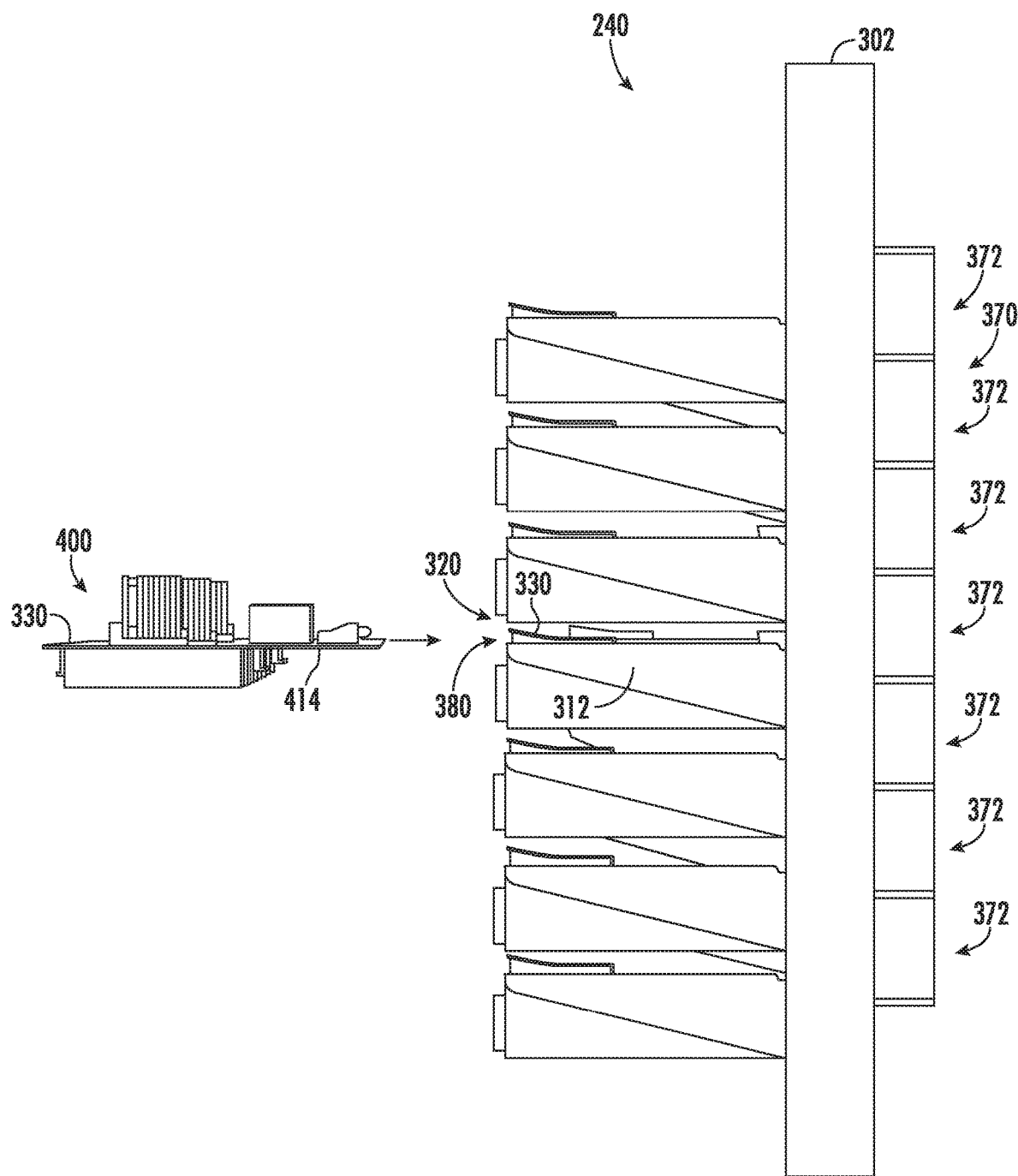
FIG. 4 is a side elevation view of the rack of FIG. 3.
Figure 5:
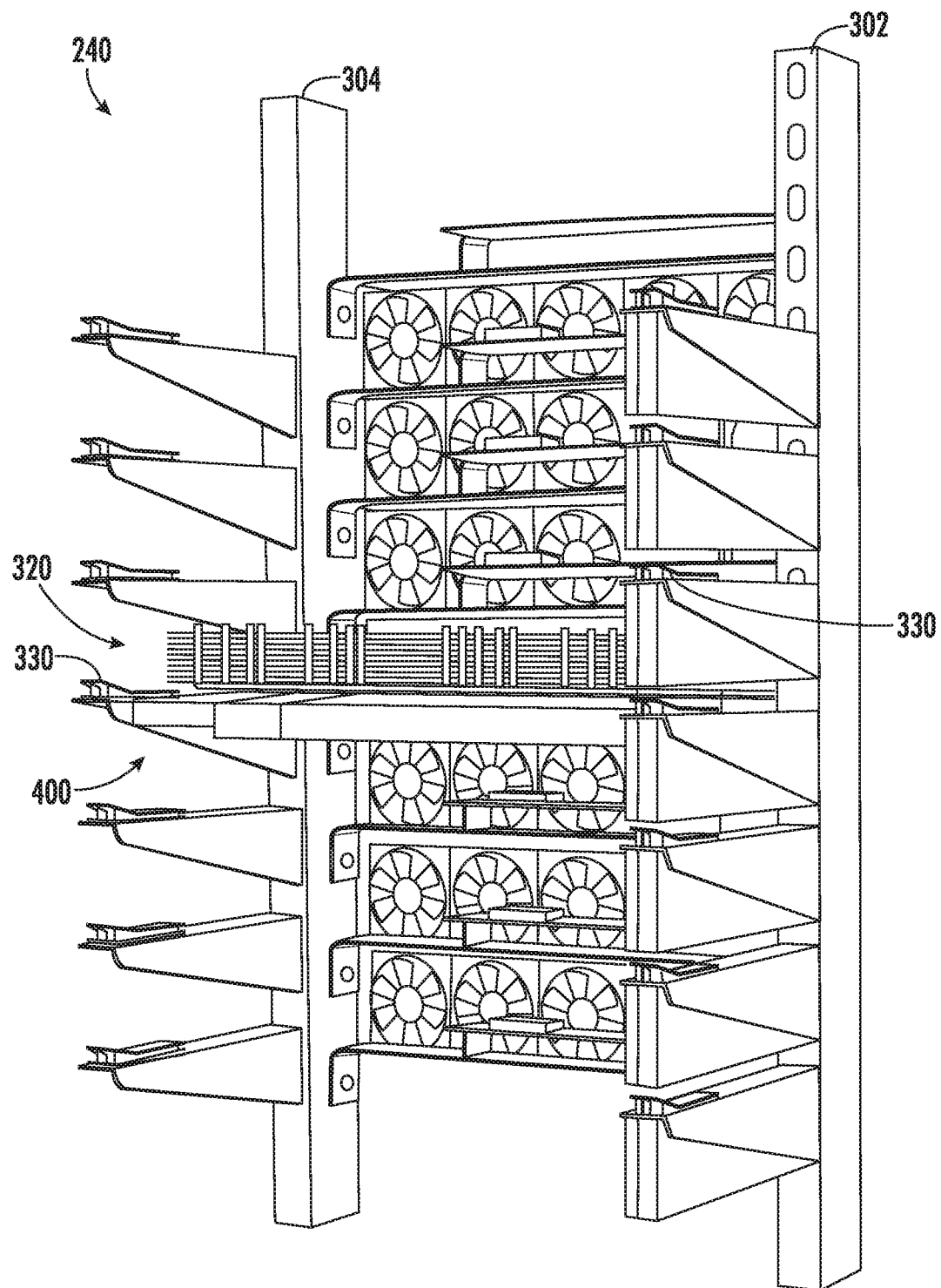
FIG. 5 is a perspective view of the rack of FIG. 3 having a sled mounted therein.

Referring now to FIGS. 3-5, each illustrative rack 240 of the data center 100 includes two elongated support posts 302, 304, which are arranged vertically. For example, the elongated support posts 302, 304 may extend upwardly from a floor of the data center 100 when deployed. The rack 240 also includes one or more horizontal pairs 310 of elongated support arms 312 (identified in FIG. 3 via a dashed ellipse) configured to support a sled of the data center 100 as discussed below. One elongated support arm 312 of the pair of elongated support arms 312 extends outwardly from the elongated support post 302 and the other elongated support arm 312 extends outwardly from the elongated support post 304.

In the illustrative embodiments, each sled of the data center 100 is embodied as a chassis-less sled. That is, each sled has a chassis-less circuit board substrate on which physical resources (e.g., processors, memory, accelerators, storage, etc.) are mounted as discussed in more detail below. As such, the rack 240 is configured to receive the chassis-less sleds. For example, each pair 310 of elongated support arms 312 defines a sled slot 320 of the rack 240, which is configured to receive a corresponding chassis-less sled. To do so, each illustrative elongated support arm 312 includes a circuit board guide 330 configured to receive the chassis-less circuit board substrate of the sled. Each circuit board guide 330 is secured to, or otherwise mounted to, a top side 332 of the corresponding elongated support arm 312. For example, in the illustrative embodiment, each circuit board guide 330 is mounted at a distal end of the corresponding elongated support arm 312 relative to the corresponding elongated support post 302, 304. For clarity of the Figures, not every circuit board guide 330 may be referenced in each Figure.

Each circuit board guide 330 includes an inner wall that defines a circuit board slot 380 configured to receive the chassis-less circuit board substrate of a sled 400 when the sled 400 is received in the corresponding sled slot 320 of the rack 240. To do so, as shown in FIG. 4, a user (or robot) aligns the chassis-less circuit board substrate of an illustrative chassis-less sled 400 to a sled slot 320. The user, or robot, may then slide the chassis-less circuit board substrate forward into the sled slot 320 such that each side edge 414 of the chassis-less circuit board substrate is received in a corresponding circuit board slot 380 of the circuit board guides 330 of the pair 310 of elongated support arms 312 that define the corresponding sled slot 320 as shown in FIG. 4. By having robotically accessible and robotically manipulable sleds comprising disaggregated resources, each type of resource can be upgraded independently of each other and at their own optimized refresh rate. Furthermore, the sleds are configured to blindly mate with power and data communication cables in each rack 240, enhancing their ability to be quickly removed, upgraded, reinstalled, and/or replaced. As such, in some embodiments, the data center 100 may operate (e.g., execute workloads, undergo maintenance and/or upgrades, etc.) without human involvement on the data center floor. In other embodiments, a human may facilitate one or more maintenance or upgrade operations in the data center 100.

It should be appreciated that each circuit board guide 330 is dual sided. That is, each circuit board guide 330 includes an inner wall that defines a circuit board slot 380 on each side of the circuit board guide 330. In this way, each circuit board guide 330 can support a chassis-less circuit board substrate on either side. As such, a single additional elongated support post may be added to the rack 240 to turn the rack 240 into a two-rack solution that can hold twice as many sled slots 320 as shown in FIG. 3. The illustrative rack 240 includes seven pairs 310 of elongated support arms 312 that define a corresponding seven sled slots 320, each configured to receive and support a corresponding sled 400 as discussed above. Of course, in other embodiments, the rack 240 may include additional or fewer pairs 310 of elongated support arms 312 (i.e., additional or fewer sled slots 320). It should be appreciated that because the sled 400 is chassis-less, the sled 400 may have an overall height that is different than typical servers. As such, in some embodiments, the height of each sled slot 320 may be shorter than the height of a typical server (e.g., shorter than a single rank unit, "1U"). That is, the vertical distance between each pair 310 of elongated support arms 312 may be less than a standard rack unit "1U." Additionally, due to the relative decrease in height of the sled slots 320, the overall height of the rack 240 in some embodiments may be shorter than the height of traditional rack enclosures. For example, in some embodiments, each of the elongated support posts 302, 304 may have a length of six feet or less. Again, in other embodiments, the rack 240 may have different dimensions. For example, in some embodiments, the vertical distance between each pair 310 of elongated support arms 312 may be greater than a standard rack until "1U". In such embodiments, the increased vertical distance between the sleds allows for larger heat sinks to be attached to the physical resources and for larger fans to be used (e.g., in the fan array 370 described below) for cooling each sled, which in turn can allow the physical resources to operate at increased power levels. Further, it should be appreciated that the rack 240 does not include any walls, enclosures, or the like. Rather, the rack 240 is an enclosure-less rack that is opened to the local environment. Of course, in some cases, an end plate may be attached to one of the elongated support posts 302, 304 in those situations in which the rack 240 forms an end-of-row rack in the data center 100.

In some embodiments, various interconnects may be routed upwardly or downwardly through the elongated support posts 302, 304. To facilitate such routing, each elongated support post 302, 304 includes an inner wall that defines an inner chamber in which interconnects may be located. The interconnects routed through the elongated support posts 302, 304 may be embodied as any type of interconnects including, but not limited to, data or communication interconnects to provide communication connections to each sled slot 320, power interconnects to provide power to each sled slot 320, and/or other types of interconnects.

The rack 240, in the illustrative embodiment, includes a support platform on which a corresponding optical data connector (not shown) is mounted. Each optical data connector is associated with a corresponding sled slot 320 and is configured to mate with an optical data connector of a corresponding sled 400 when the sled 400 is received in the corresponding sled slot 320. In some embodiments, optical connections between components (e.g., sleds, racks, and switches) in the data center 100 are made with a blind mate optical connection. For example, a door on each cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 240 also includes a fan array 370 coupled to the cross-support arms of the rack 240. The fan array 370 includes one or more rows of cooling fans 372, which are aligned in a horizontal line between the elongated support posts 302, 304. In the illustrative embodiment, the fan array 370 includes a row of cooling fans 372 for each sled slot 320 of the rack 240. As discussed above, each sled 400 does not include any on-board cooling system in the illustrative embodiment and, as such, the fan array 370 provides cooling for each sled 400 received in the rack 240. Each rack 240, in the illustrative embodiment, also includes a power supply associated with each sled slot 320. Each power supply is secured to one of the elongated support arms 312 of the pair 310 of elongated support arms 312 that define the corresponding sled slot 320. For example, the rack 240 may include a power supply coupled or secured to each elongated support arm 312 extending from the elongated support post 302. Each power supply includes a power connector configured to mate with a power connector of the sled 400 when the sled 400 is received in the corresponding sled slot 320. In the illustrative embodiment, the sled 400 does not include any on-board power supply and, as such, the power supplies provided in the rack 240 supply power to corresponding sleds 400 when mounted to the rack 240. Each power supply is configured to satisfy the power requirements for its associated sled, which can vary from sled to sled. Additionally, the power supplies provided in the rack 240 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 6:
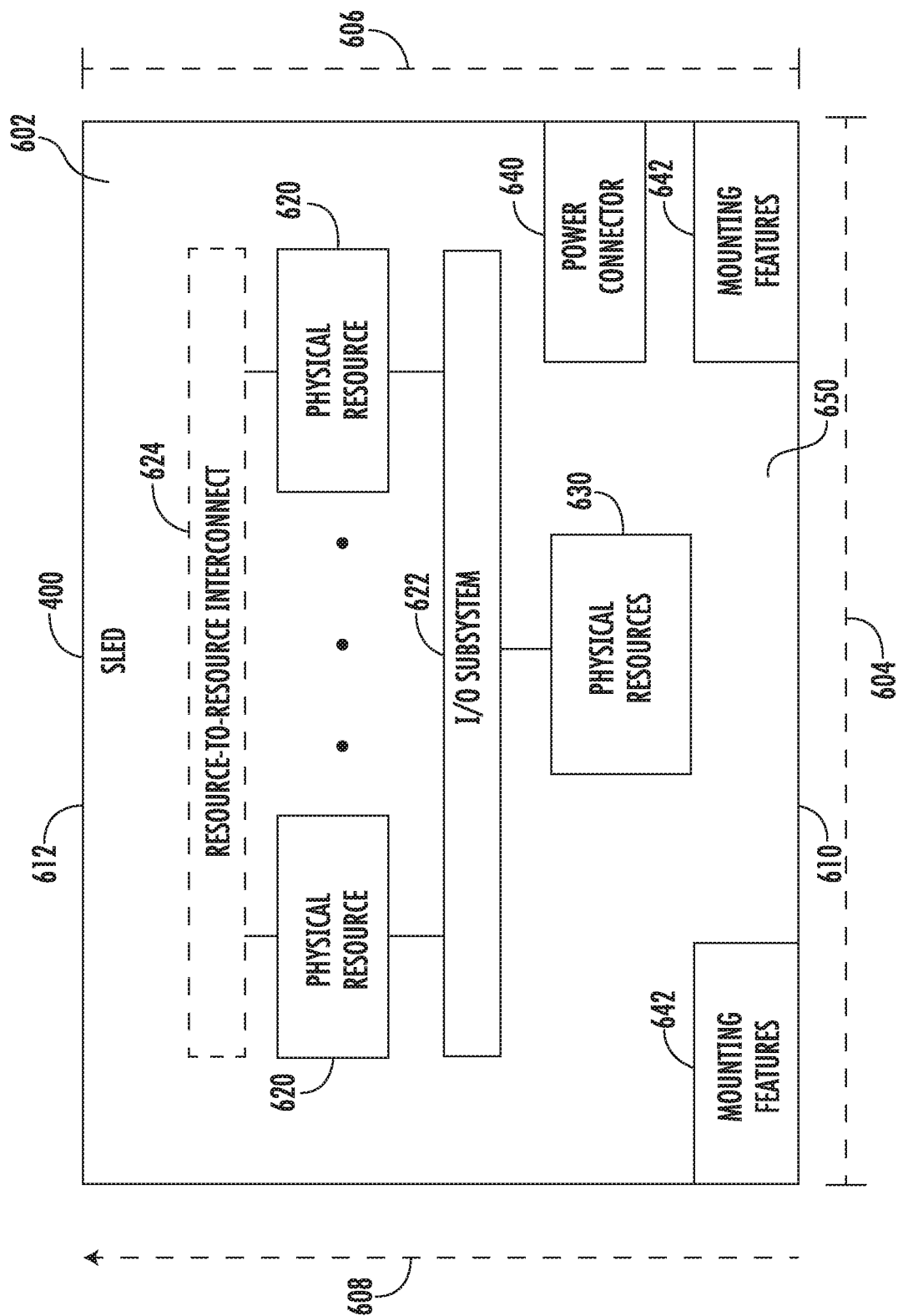
FIG. 6 is a is a simplified block diagram of at least one embodiment of a top side of the sled of FIG. 5.

Referring now to FIG. 6, the sled 400, in the illustrative embodiment, is configured to be mounted in a corresponding rack 240 of the data center 100 as discussed above. In some embodiments, each sled 400 may be optimized or otherwise configured for performing particular tasks, such as compute tasks, acceleration tasks, data storage tasks, etc. For example, the sled 400 may be embodied as a compute sled 800 as discussed below in regard to FIGS. 8-9, an accelerator sled 1000 as discussed below in regard to FIGS. 10-11, a storage sled 1200 as discussed below in regard to FIGS. 12-13, or as a sled optimized or otherwise configured to perform other specialized tasks, such as a memory sled 1400, discussed below in regard to FIG. 14.

As discussed above, the illustrative sled 400 includes a chassis-less circuit board substrate 602, which supports various physical resources (e.g., electrical components) mounted thereon. It should be appreciated that the circuit board substrate 602 is "chassis-less" in that the sled 400 does not include a housing or enclosure. Rather, the chassis-less circuit board substrate 602 is open to the local environment. The chassis-less circuit board substrate 602 may be formed from any material capable of supporting the various electrical components mounted thereon. For example, in an illustrative embodiment, the chassis-less circuit board substrate 602 is formed from an FR-4 glass-reinforced epoxy laminate material. Of course, other materials may be used to form the chassis-less circuit board substrate 602 in other embodiments.

As discussed in more detail below, the chassis-less circuit board substrate 602 includes multiple features that improve the thermal cooling characteristics of the various electrical components mounted on the chassis-less circuit board substrate 602. As discussed, the chassis-less circuit board substrate 602 does not include a housing or enclosure, which may improve the airflow over the electrical components of the sled 400 by reducing those structures that may inhibit air flow. For example, because the chassis-less circuit board substrate 602 is not positioned in an individual housing or enclosure, there is no vertically-arranged backplane (e.g., a backplate of the chassis) attached to the chassis-less circuit board substrate 602, which could inhibit air flow across the electrical components. Additionally, the chassis-less circuit board substrate 602 has a geometric shape configured to reduce the length of the airflow path across the electrical components mounted to the chassis-less circuit board substrate 602. For example, the illustrative chassis-less circuit board substrate 602 has a width 604 that is greater than a depth 606 of the chassis-less circuit board substrate 602. In one particular embodiment, for example, the chassis-less circuit board substrate 602 has a width of about 21 inches and a depth of about 9 inches, compared to a typical server that has a width of about 17 inches and a depth of about 39 inches. As such, an airflow path 608 that extends from a front edge 610 of the chassis-less circuit board substrate 602 toward a rear edge 612 has a shorter distance relative to typical servers, which may improve the thermal cooling characteristics of the sled 400. Furthermore, although not illustrated in FIG. 6, the various physical resources mounted to the chassis-less circuit board substrate 602 are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 602 linearly in-line with each other along the direction of the airflow path 608 (i.e., along a direction extending from the front edge 610 toward the rear edge 612 of the chassis-less circuit board substrate 602).

As discussed above, the illustrative sled 400 includes one or more physical resources 620 mounted to a top side 650 of the chassis-less circuit board substrate 602. Although two physical resources 620 are shown in FIG. 6, it should be appreciated that the sled 400 may include one, two, or more physical resources 620 in other embodiments. The physical resources 620 may be embodied as any type of processor, controller, or other compute circuit capable of performing various tasks such as compute functions and/or controlling the functions of the sled 400 depending on, for example, the type or intended functionality of the sled 400. For example, as discussed in more detail below, the physical resources 620 may be embodied as high-performance processors in embodiments in which the sled 400 is embodied as a compute sled, as accelerator co-processors or circuits in embodiments in which the sled 400 is embodied as an accelerator sled, storage controllers in embodiments in which the sled 400 is embodied as a storage sled, or a set of memory devices in embodiments in which the sled 400 is embodied as a memory sled.

The sled 400 also includes one or more additional physical resources 630 mounted to the top side 650 of the chassis-less circuit board substrate 602. In the illustrative embodiment, the additional physical resources include a network interface controller (NIC) as discussed in more detail below. Of course, depending on the type and functionality of the sled 400, the physical resources 630 may include additional or other electrical components, circuits, and/or devices in other embodiments.

The physical resources 620 are communicatively coupled to the physical resources 630 via an input/output (I/O) subsystem 622. The I/O subsystem 622 may be embodied as circuitry and/or components to facilitate input/output operations with the physical resources 620, the physical resources 630, and/or other components of the sled 400. For example, the I/O subsystem 622 may be embodied as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative embodiment, the I/O subsystem 622 is embodied as, or otherwise includes, a double data rate 4 (DDR4) data bus or a DDR5 data bus.

In some embodiments, the sled 400 may also include a resource-to-resource interconnect 624. The resource-to-resource interconnect 624 may be embodied as any type of communication interconnect capable of facilitating resource-to-resource communications. In the illustrative embodiment, the resource-to-resource interconnect 624 is embodied as a high-speed point-to-point interconnect (e.g., faster than the I/O subsystem 622). For example, the resource-to-resource interconnect 624 may be embodied as a QuickPath Interconnect (QPI), an UltraPath Interconnect (UPI), or other high-speed point-to-point interconnect dedicated to resource-to-resource communications.

The sled 400 also includes a power connector 640 configured to mate with a corresponding power connector of the rack 240 when the sled 400 is mounted in the corresponding rack 240. The sled 400 receives power from a power supply of the rack 240 via the power connector 640 to supply power to the various electrical components of the sled 400. That is, the sled 400 does not include any local power supply (i.e., an on-board power supply) to provide power to the electrical components of the sled 400. The exclusion of a local or on-board power supply facilitates the reduction in the overall footprint of the chassis-less circuit board substrate 602, which may increase the thermal cooling characteristics of the various electrical components mounted on the chassis-less circuit board substrate 602 as discussed above. In some embodiments, voltage regulators are placed on a bottom side 750 (see FIG. 7) of the chassis-less circuit board substrate 602 directly opposite of the processors 820 (see FIG. 8), and power is routed from the voltage regulators to the processors 820 by vias extending through the circuit board substrate 602. Such a configuration provides an increased thermal budget, additional current and/or voltage, and better voltage control relative to typical printed circuit boards in which processor power is delivered from a voltage regulator, in part, by printed circuit traces.

In some embodiments, the sled 400 may also include mounting features 642 configured to mate with a mounting arm, or other structure, of a robot to facilitate the placement of the sled 600 in a rack 240 by the robot. The mounting features 642 may be embodied as any type of physical structures that allow the robot to grasp the sled 400 without damaging the chassis-less circuit board substrate 602 or the electrical components mounted thereto. For example, in some embodiments, the mounting features 642 may be embodied as non-conductive pads attached to the chassis-less circuit board substrate 602. In other embodiments, the mounting features may be embodied as brackets, braces, or other similar structures attached to the chassis-less circuit board substrate 602. The particular number, shape, size, and/or make-up of the mounting feature 642 may depend on the design of the robot configured to manage the sled 400.

Figure 7:
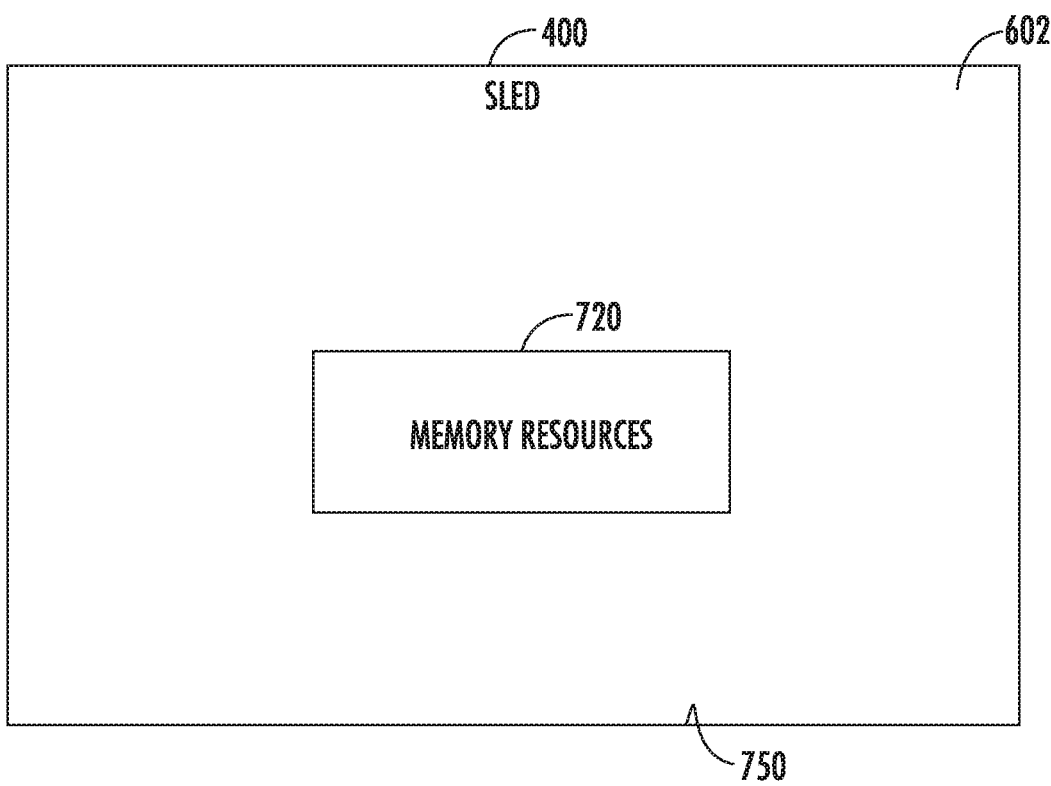
FIG. 7 is a simplified block diagram of at least one embodiment of a bottom side of the sled of FIG. 6.

Referring now to FIG. 7, in addition to the physical resources 630 mounted on the top side 650 of the chassis-less circuit board substrate 602, the sled 400 also includes one or more memory devices 720 mounted to a bottom side 750 of the chassis-less circuit board substrate 602. That is, the chassis-less circuit board substrate 602 is embodied as a double-sided circuit board. The physical resources 620 are communicatively coupled to the memory devices 720 via the I/O subsystem 622. For example, the physical resources 620 and the memory devices 720 may be communicatively coupled by one or more vias extending through the chassis-less circuit board substrate 602. Each physical resource 620 may be communicatively coupled to a different set of one or more memory devices 720 in some embodiments. Alternatively, in other embodiments, each physical resource 620 may be communicatively coupled to each memory device 720.

The memory devices 720 may be embodied as any type of memory device capable of storing data for the physical resources 620 during operation of the sled 400, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one embodiment, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some embodiments, the memory device may comprise a transistor-less stackable cross point architecture in which memory cells sit at the intersection of word lines and bit lines and are individually addressable and in which bit storage is based on a change in bulk resistance.

Figure 8:
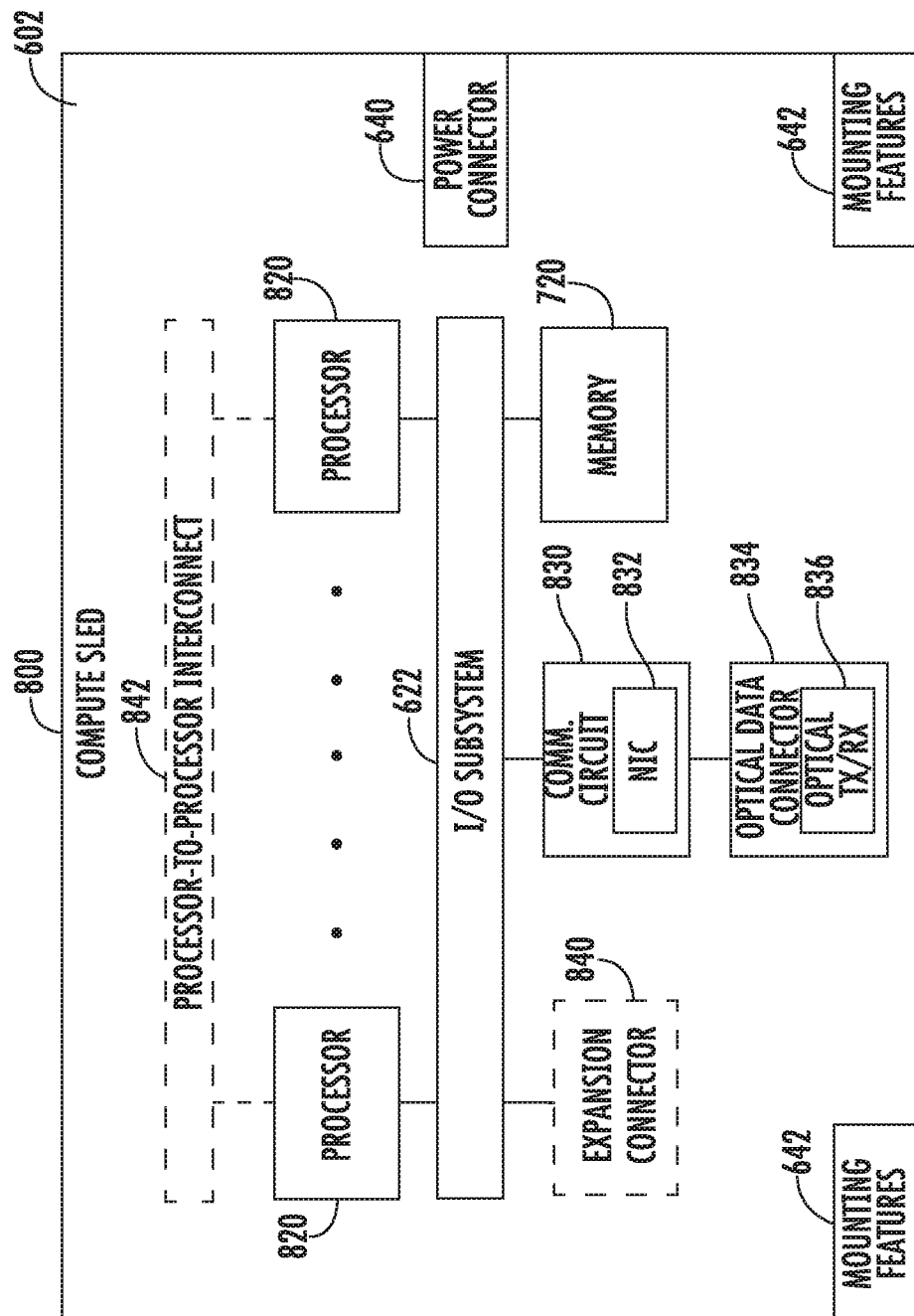
FIG. 8 is a simplified block diagram of at least one embodiment of a compute sled usable in the data center of FIG. 1.

Referring now to FIG. 8, in some embodiments, the sled 400 may be embodied as a compute sled 800. The compute sled 800 is optimized, or otherwise configured, to perform compute tasks. Of course, as discussed above, the compute sled 800 may rely on other sleds, such as acceleration sleds and/or storage sleds, to perform such compute tasks. The compute sled 800 includes various physical resources (e.g., electrical components) similar to the physical resources of the sled 400, which have been identified in FIG. 8 using the same reference numbers. The description of such components provided above in regard to FIGS. 6 and 7 applies to the corresponding components of the compute sled 800 and is not repeated herein for clarity of the description of the compute sled 800.

In the illustrative compute sled 800, the physical resources 620 are embodied as processors 820. Although only two processors 820 are shown in FIG. 8, it should be appreciated that the compute sled 800 may include additional processors 820 in other embodiments. Illustratively, the processors 820 are embodied as high-performance processors 820 and may be configured to operate at a relatively high power rating. Although the processors 820 generate additional heat operating at power ratings greater than typical processors (which operate at around 155-230 W), the enhanced thermal cooling characteristics of the chassis-less circuit board substrate 602 discussed above facilitate the higher power operation. For example, in the illustrative embodiment, the processors 820 are configured to operate at a power rating of at least 250 W. In some embodiments, the processors 820 may be configured to operate at a power rating of at least 350 W.

In some embodiments, the compute sled 800 may also include a processor-to-processor interconnect 842. Similar to the resource-to-resource interconnect 624 of the sled 400 discussed above, the processor-to-processor interconnect 842 may be embodied as any type of communication interconnect capable of facilitating processor-to-processor interconnect 842 communications. In the illustrative embodiment, the processor-to-processor interconnect 842 is embodied as a high-speed point-to-point interconnect (e.g., faster than the I/O subsystem 622). For example, the processor-to-processor interconnect 842 may be embodied as a QuickPath Interconnect (QPI), an UltraPath Interconnect (UPI), or other high-speed point-to-point interconnect dedicated to processor-to-processor communications.

The compute sled 800 also includes a communication circuit 830. The illustrative communication circuit 830 includes a network interface controller (NIC) 832, which may also be referred to as a host fabric interface (HFI). The NIC 832 may be embodied as, or otherwise include, any type of integrated circuit, discrete circuits, controller chips, chipsets, add-in-boards, daughtercards, network interface cards, or other devices that may be used by the compute sled 800 to connect with another compute device (e.g., with other sleds 400). In some embodiments, the NIC 832 may be embodied as part of a system-on-a-chip (SoC) that includes one or more processors, or included on a multichip package that also contains one or more processors. In some embodiments, the NIC 832 may include a local processor (not shown) and/or a local memory (not shown) that are both local to the NIC 832. In such embodiments, the local processor of the NIC 832 may be capable of performing one or more of the functions of the processors 820. Additionally or alternatively, in such embodiments, the local memory of the NIC 832 may be integrated into one or more components of the compute sled at the board level, socket level, chip level, and/or other levels.

The communication circuit 830 is communicatively coupled to an optical data connector 834. The optical data connector 834 is configured to mate with a corresponding optical data connector of the rack 240 when the compute sled 800 is mounted in the rack 240. Illustratively, the optical data connector 834 includes a plurality of optical fibers which lead from a mating surface of the optical data connector 834 to an optical transceiver 836. The optical transceiver 836 is configured to convert incoming optical signals from the rack-side optical data connector to electrical signals and to convert electrical signals to outgoing optical signals to the rack-side optical data connector. Although shown as forming part of the optical data connector 834 in the illustrative embodiment, the optical transceiver 836 may form a portion of the communication circuit 830 in other embodiments.

In some embodiments, the compute sled 800 may also include an expansion connector 840. In such embodiments, the expansion connector 840 is configured to mate with a corresponding connector of an expansion chassis-less circuit board substrate to provide additional physical resources to the compute sled 800. The additional physical resources may be used, for example, by the processors 820 during operation of the compute sled 800. The expansion chassis-less circuit board substrate may be substantially similar to the chassis-less circuit board substrate 602 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 9:
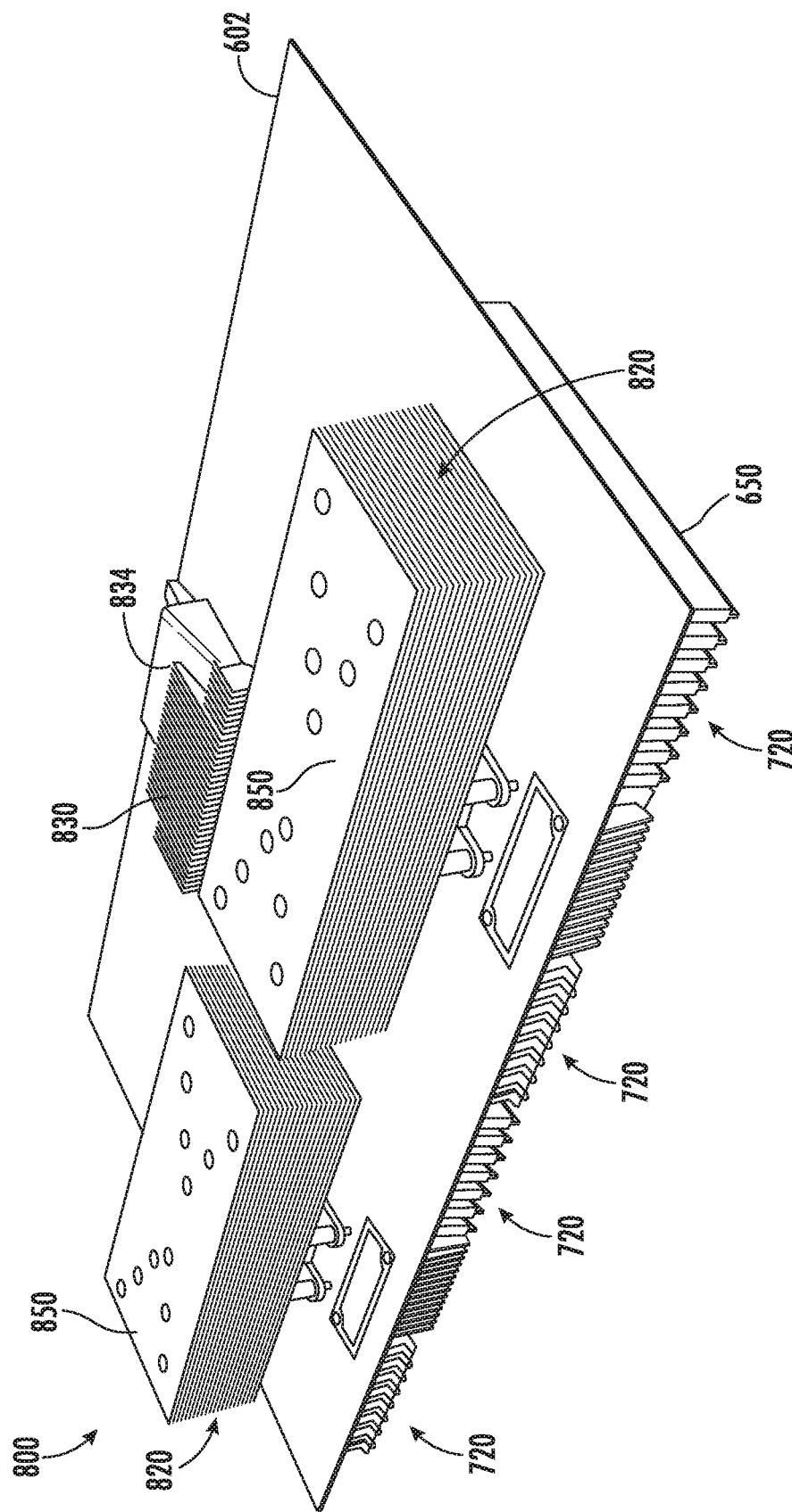
FIG. 9 is a top perspective view of at least one embodiment of the compute sled of FIG. 8.

Referring now to FIG. 9, an illustrative embodiment of the compute sled 800 is shown. As shown, the processors 820, communication circuit 830, and optical data connector 834 are mounted to the top side 650 of the chassis-less circuit board substrate 602. Any suitable attachment or mounting technology may be used to mount the physical resources of the compute sled 800 to the chassis-less circuit board substrate 602. For example, the various physical resources may be mounted in corresponding sockets (e.g., a processor socket), holders, or brackets. In some cases, some of the electrical components may be directly mounted to the chassis-less circuit board substrate 602 via soldering or similar techniques.

As discussed above, the individual processors 820 and communication circuit 830 are mounted to the top side 650 of the chassis-less circuit board substrate 602 such that no two heat-producing, electrical components shadow each other. In the illustrative embodiment, the processors 820 and communication circuit 830 are mounted in corresponding locations on the top side 650 of the chassis-less circuit board substrate 602 such that no two of those physical resources are linearly in-line with others along the direction of the airflow path 608. It should be appreciated that, although the optical data connector 834 is in-line with the communication circuit 830, the optical data connector 834 produces no or nominal heat during operation.

The memory devices 720 of the compute sled 800 are mounted to the bottom side 750 of the of the chassis-less circuit board substrate 602 as discussed above in regard to the sled 400. Although mounted to the bottom side 750, the memory devices 720 are communicatively coupled to the processors 820 located on the top side 650 via the I/O subsystem 622. Because the chassis-less circuit board substrate 602 is embodied as a double-sided circuit board, the memory devices 720 and the processors 820 may be communicatively coupled by one or more vias, connectors, or other mechanisms extending through the chassis-less circuit board substrate 602. Of course, each processor 820 may be communicatively coupled to a different set of one or more memory devices 720 in some embodiments. Alternatively, in other embodiments, each processor 820 may be communicatively coupled to each memory device 720. In some embodiments, the memory devices 720 may be mounted to one or more memory mezzanines on the bottom side of the chassis-less circuit board substrate 602 and may interconnect with a corresponding processor 820 through a ball-grid array.

Each of the processors 820 includes a heatsink 850 secured thereto. Due to the mounting of the memory devices 720 to the bottom side 750 of the chassis-less circuit board substrate 602 (as well as the vertical spacing of the sleds 400 in the corresponding rack 240), the top side 650 of the chassis-less circuit board substrate 602 includes additional "free" area or space that facilitates the use of heatsinks 850 having a larger size relative to traditional heatsinks used in typical servers. Additionally, due to the improved thermal cooling characteristics of the chassis-less circuit board substrate 602, none of the processor heatsinks 850 include cooling fans attached thereto. That is, each of the heatsinks 850 is embodied as a fan-less heatsink. In some embodiments, the heat sinks 850 mounted atop the processors 820 may overlap with the heat sink attached to the communication circuit 830 in the direction of the airflow path 608 due to their increased size, as illustratively suggested by FIG. 9.

Figure 10:
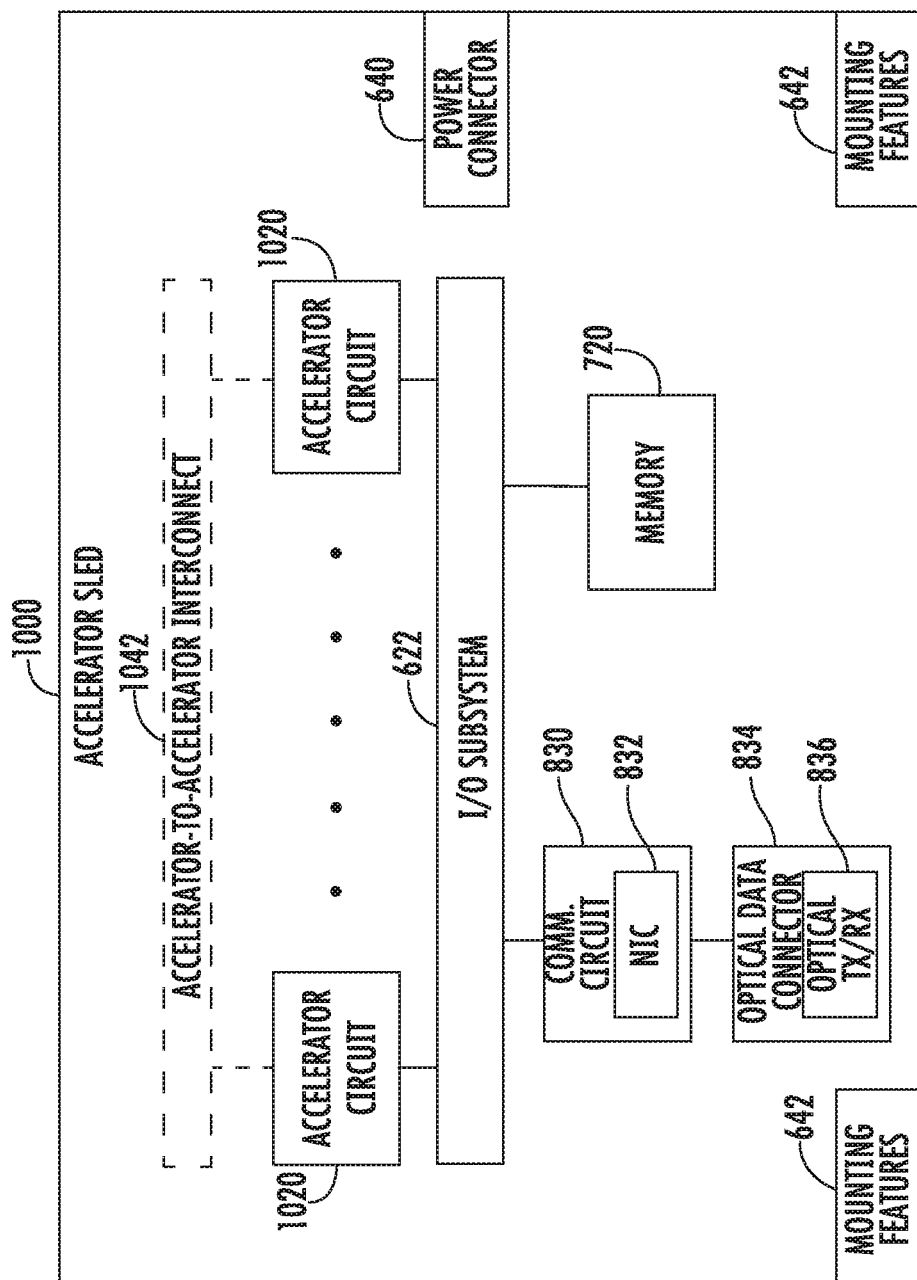
FIG. 10 is a simplified block diagram of at least one embodiment of an accelerator sled usable in the data center of FIG. 1.

Referring now to FIG. 10, in some embodiments, the sled 400 may be embodied as an accelerator sled 1000. The accelerator sled 1000 is configured, to perform specialized compute tasks, such as machine learning, encryption, hashing, or other computational-intensive task. In some embodiments, for example, a compute sled 800 may offload tasks to the accelerator sled 1000 during operation. The accelerator sled 1000 includes various components similar to components of the sled 400 and/or compute sled 800, which have been identified in FIG. 10 using the same reference numbers. The description of such components provided above in regard to FIGS. 6, 7, and 8 apply to the corresponding components of the accelerator sled 1000 and is not repeated herein for clarity of the description of the accelerator sled 1000.

Figure 11:
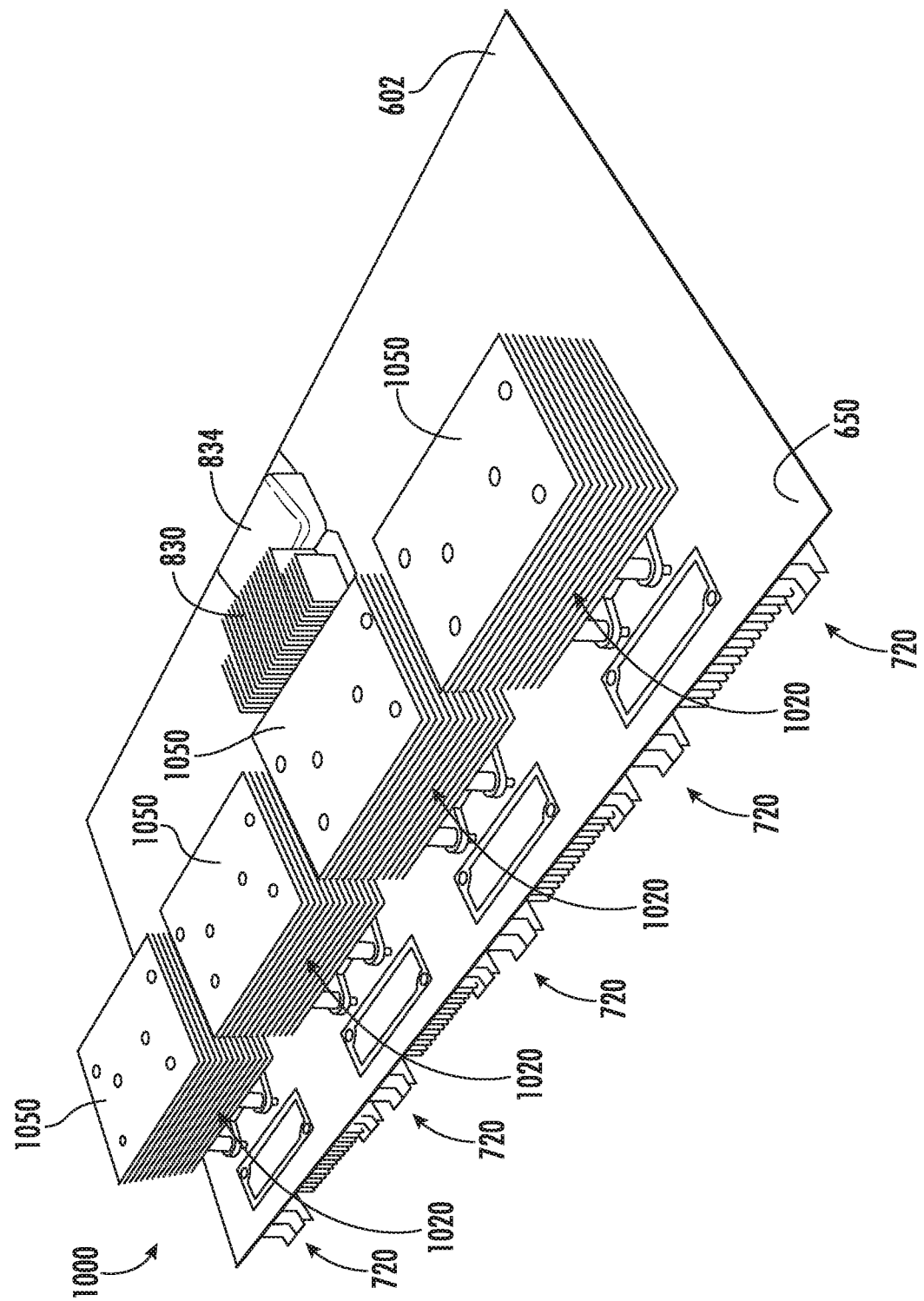
FIG. 11 is a top perspective view of at least one embodiment of the accelerator sled of FIG. 10.

In the illustrative accelerator sled 1000, the physical resources 620 are embodied as accelerator circuits 1020. Although only two accelerator circuits 1020 are shown in FIG. 10, it should be appreciated that the accelerator sled 1000 may include additional accelerator circuits 1020 in other embodiments. For example, as shown in FIG. 11, the accelerator sled 1000 may include four accelerator circuits 1020 in some embodiments. The accelerator circuits 1020 may be embodied as any type of processor, co-processor, compute circuit, or other device capable of performing compute or processing operations. For example, the accelerator circuits 1020 may be embodied as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some embodiments, the accelerator sled 1000 may also include an accelerator-to-accelerator interconnect 1042. Similar to the resource-to-resource interconnect 624 of the sled 600 discussed above, the accelerator-to-accelerator interconnect 1042 may be embodied as any type of communication interconnect capable of facilitating accelerator-to-accelerator communications. In the illustrative embodiment, the accelerator-to-accelerator interconnect 1042 is embodied as a high-speed point-to-point interconnect (e.g., faster than the I/O subsystem 622). For example, the accelerator-to-accelerator interconnect 1042 may be embodied as a QuickPath Interconnect (QPI), an UltraPath Interconnect (UPI), or other high-speed point-to-point interconnect dedicated to processor-to-processor communications. In some embodiments, the accelerator circuits 1020 may be daisy-chained with a primary accelerator circuit 1020 connected to the NIC 832 and memory 720 through the I/O subsystem 622 and a secondary accelerator circuit 1020 connected to the NIC 832 and memory 720 through a primary accelerator circuit 1020.

Referring now to FIG. 11, an illustrative embodiment of the accelerator sled 1000 is shown. As discussed above, the accelerator circuits 1020, communication circuit 830, and optical data connector 834 are mounted to the top side 650 of the chassis-less circuit board substrate 602. Again, the individual accelerator circuits 1020 and communication circuit 830 are mounted to the top side 650 of the chassis-less circuit board substrate 602 such that no two heat-producing, electrical components shadow each other as discussed above. The memory devices 720 of the accelerator sled 1000 are mounted to the bottom side 750 of the of the chassis-less circuit board substrate 602 as discussed above in regard to the sled 600. Although mounted to the bottom side 750, the memory devices 720 are communicatively coupled to the accelerator circuits 1020 located on the top side 650 via the I/O subsystem 622 (e.g., through vias). Further, each of the accelerator circuits 1020 may include a heatsink 1070 that is larger than a traditional heatsink used in a server. As discussed above with reference to the heatsinks 870, the heatsinks 1070 may be larger than traditional heatsinks because of the "free" area provided by the memory resources 720 being located on the bottom side 750 of the chassis-less circuit board substrate 602 rather than on the top side 650.

Figure 12:
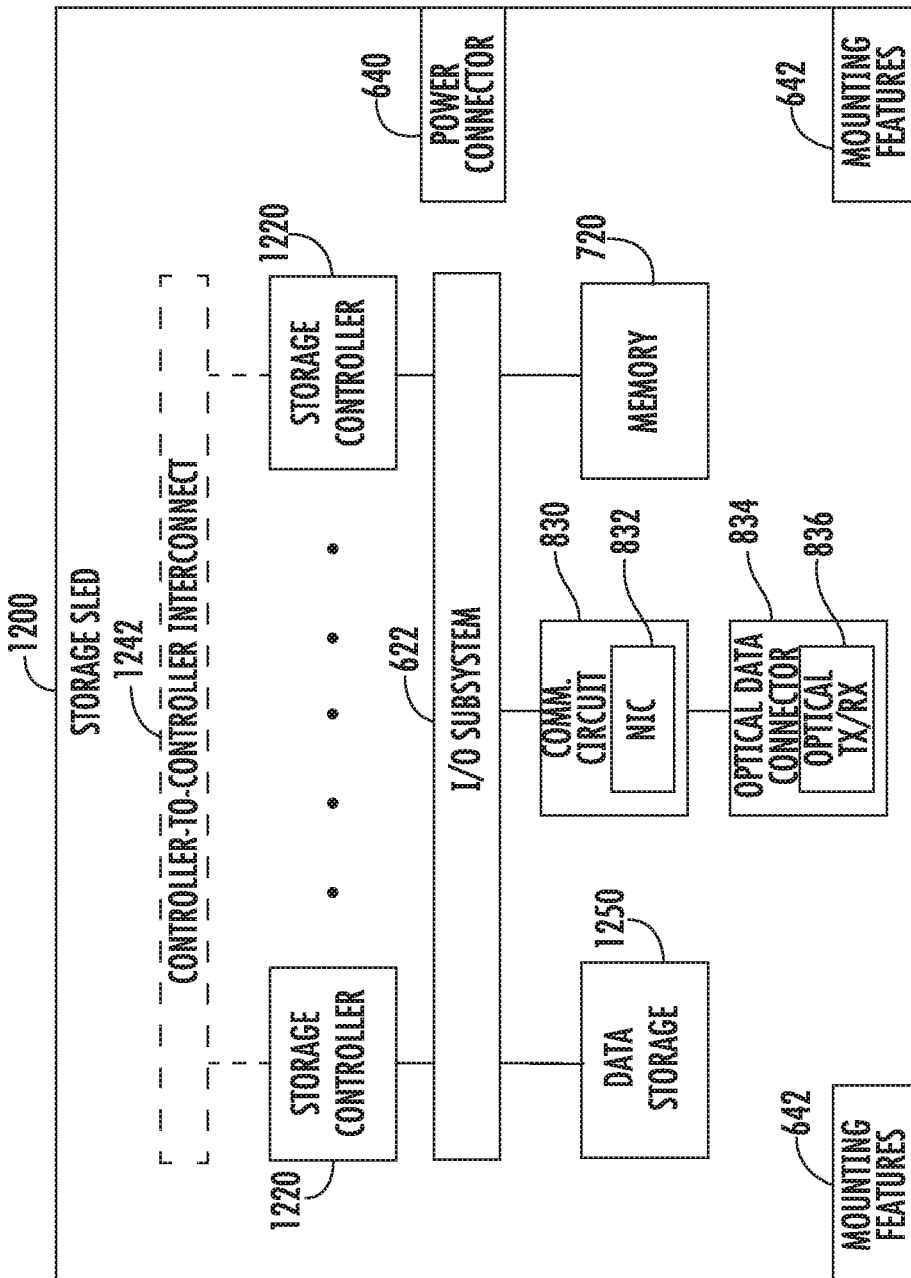
FIG. 12 is a simplified block diagram of at least one embodiment of a storage sled usable in the data center of FIG. 1.

Referring now to FIG. 12, in some embodiments, the sled 400 may be embodied as a storage sled 1200. The storage sled 1200 is configured, to store data in a data storage 1250 local to the storage sled 1200. For example, during operation, a compute sled 800 or an accelerator sled 1000 may store and retrieve data from the data storage 1250 of the storage sled 1200. The storage sled 1200 includes various components similar to components of the sled 400 and/or the compute sled 800, which have been identified in FIG. 12 using the same reference numbers. The description of such components provided above in regard to FIGS. 6, 7, and 8 apply to the corresponding components of the storage sled 1200 and is not repeated herein for clarity of the description of the storage sled 1200.

In the illustrative storage sled 1200, the physical resources 620 are embodied as storage controllers 1220. Although only two storage controllers 1220 are shown in FIG. 12, it should be appreciated that the storage sled 1200 may include additional storage controllers 1220 in other embodiments. The storage controllers 1220 may be embodied as any type of processor, controller, or control circuit capable of controlling the storage and retrieval of data into the data storage 1250 based on requests received via the communication circuit 830. In the illustrative embodiment, the storage controllers 1220 are embodied as relatively low-power processors or controllers. For example, in some embodiments, the storage controllers 1220 may be configured to operate at a power rating of about 75 watts.

In some embodiments, the storage sled 1200 may also include a controller-to-controller interconnect 1242. Similar to the resource-to-resource interconnect 624 of the sled 400 discussed above, the controller-to-controller interconnect 1242 may be embodied as any type of communication interconnect capable of facilitating controller-to-controller communications. In the illustrative embodiment, the controller-to-controller interconnect 1242 is embodied as a high-speed point-to-point interconnect (e.g., faster than the I/O subsystem 622). For example, the controller-to-controller interconnect 1242 may be embodied as a QuickPath Interconnect (QPI), an UltraPath Interconnect (UPI), or other high-speed point-to-point interconnect dedicated to processor-to-processor communications.

Figure 13:
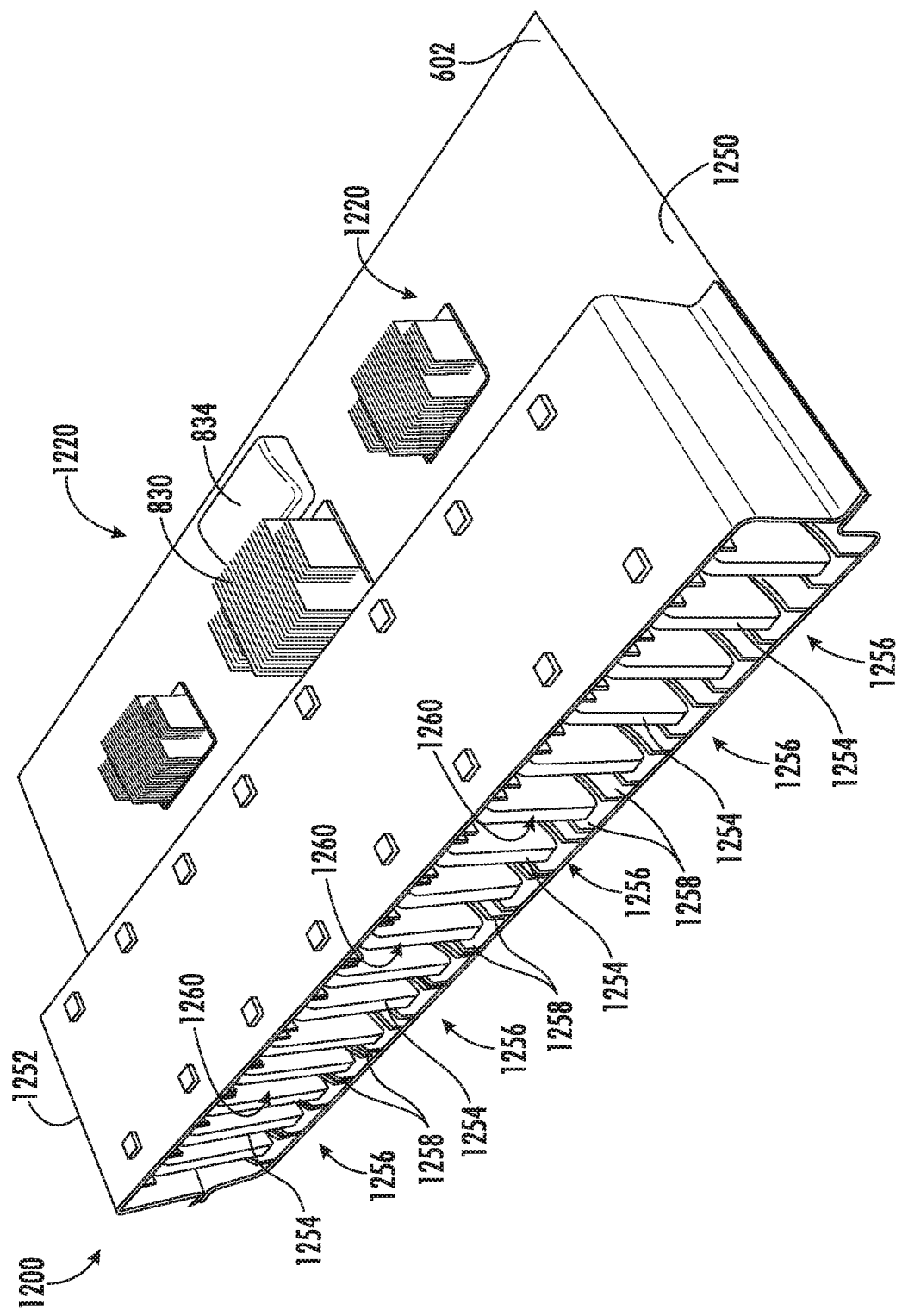
FIG. 13 is a top perspective view of at least one embodiment of the storage sled of FIG. 12.

Referring now to FIG. 13, an illustrative embodiment of the storage sled 1200 is shown. In the illustrative embodiment, the data storage 1250 is embodied as, or otherwise includes, a storage cage 1252 configured to house one or more solid state drives (SSDs) 1254. To do so, the storage cage 1252 includes a number of mounting slots 1256, each of which is configured to receive a corresponding solid state drive 1254. Each of the mounting slots 1256 includes a number of drive guides 1258 that cooperate to define an access opening 1260 of the corresponding mounting slot 1256. The storage cage 1252 is secured to the chassis-less circuit board substrate 602 such that the access openings face away from (i.e., toward the front of) the chassis-less circuit board substrate 602. As such, solid state drives 1254 are accessible while the storage sled 1200 is mounted in a corresponding rack 204. For example, a solid state drive 1254 may be swapped out of a rack 240 (e.g., via a robot) while the storage sled 1200 remains mounted in the corresponding rack 240.

The storage cage 1252 illustratively includes sixteen mounting slots 1256 and is capable of mounting and storing sixteen solid state drives 1254. Of course, the storage cage 1252 may be configured to store additional or fewer solid state drives 1254 in other embodiments. Additionally, in the illustrative embodiment, the solid state drivers are mounted vertically in the storage cage 1252, but may be mounted in the storage cage 1252 in a different orientation in other embodiments. Each solid state drive 1254 may be embodied as any type of data storage device capable of storing long term data. To do so, the solid state drives 1254 may include volatile and non-volatile memory devices discussed above.

As shown in FIG. 13, the storage controllers 1220, the communication circuit 830, and the optical data connector 834 are illustratively mounted to the top side 650 of the chassis-less circuit board substrate 602. Again, as discussed above, any suitable attachment or mounting technology may be used to mount the electrical components of the storage sled 1200 to the chassis-less circuit board substrate 602 including, for example, sockets (e.g., a processor socket), holders, brackets, soldered connections, and/or other mounting or securing techniques.

As discussed above, the individual storage controllers 1220 and the communication circuit 830 are mounted to the top side 650 of the chassis-less circuit board substrate 602 such that no two heat-producing, electrical components shadow each other. For example, the storage controllers 1220 and the communication circuit 830 are mounted in corresponding locations on the top side 650 of the chassis-less circuit board substrate 602 such that no two of those electrical components are linearly in-line with each other along the direction of the airflow path 608.

The memory devices 720 of the storage sled 1200 are mounted to the bottom side 750 of the of the chassis-less circuit board substrate 602 as discussed above in regard to the sled 400. Although mounted to the bottom side 750, the memory devices 720 are communicatively coupled to the storage controllers 1220 located on the top side 650 via the I/O subsystem 622. Again, because the chassis-less circuit board substrate 602 is embodied as a double-sided circuit board, the memory devices 720 and the storage controllers 1220 may be communicatively coupled by one or more vias, connectors, or other mechanisms extending through the chassis-less circuit board substrate 602. Each of the storage controllers 1220 includes a heatsink 1270 secured thereto. As discussed above, due to the improved thermal cooling characteristics of the chassis-less circuit board substrate 602 of the storage sled 1200, none of the heatsinks 1270 include cooling fans attached thereto. That is, each of the heatsinks 1270 is embodied as a fan-less heatsink.

Figure 14:
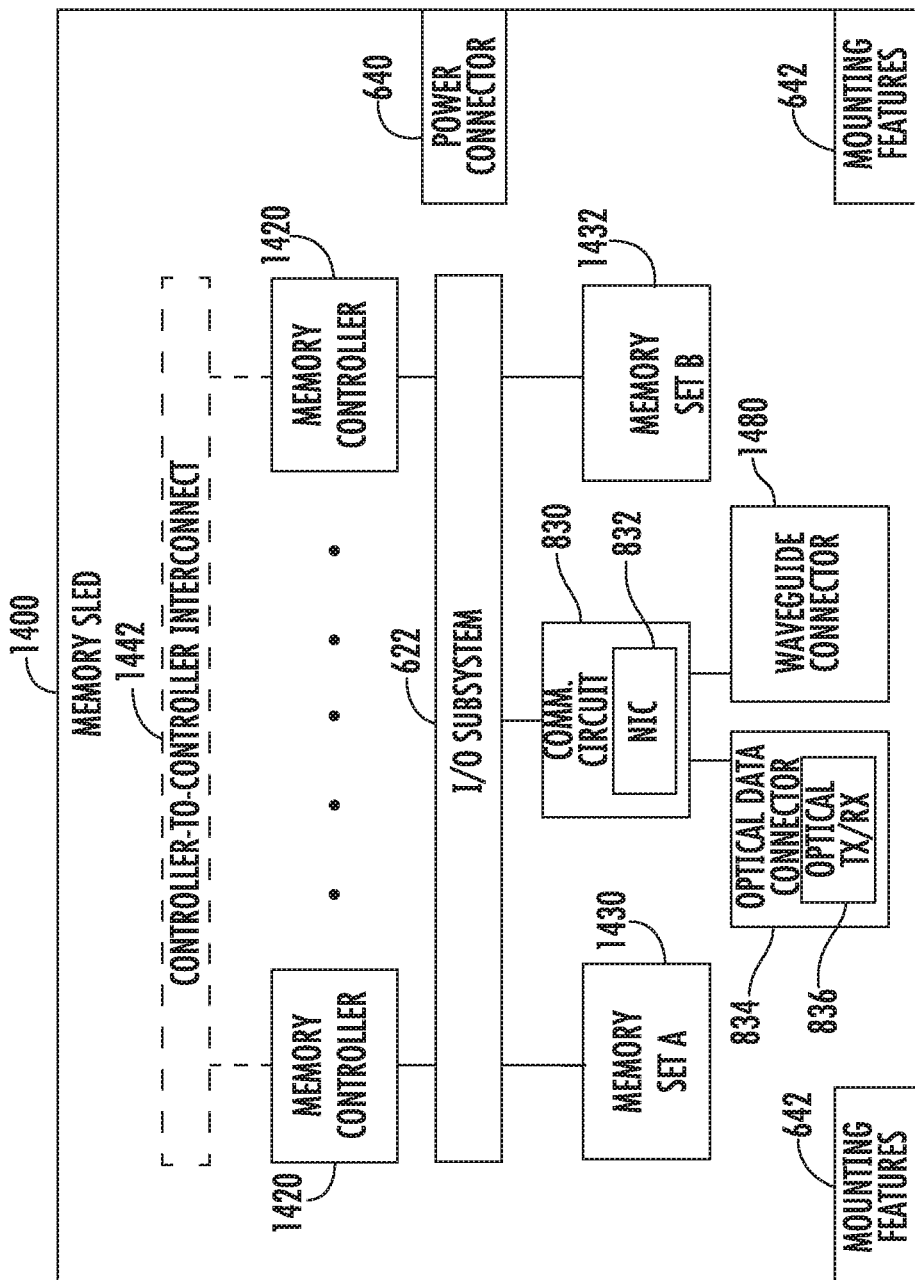
FIG. 14 is a simplified block diagram of at least one embodiment of a memory sled usable in the data center of FIG. 1.

Referring now to FIG. 14, in some embodiments, the sled 400 may be embodied as a memory sled 1400. The storage sled 1400 is optimized, or otherwise configured, to provide other sleds 400 (e.g., compute sleds 800, accelerator sleds 1000, etc.) with access to a pool of memory (e.g., in two or more sets 1430, 1432 of memory devices 720) local to the memory sled 1200. For example, during operation, a compute sled 800 or an accelerator sled 1000 may remotely write to and/or read from one or more of the memory sets 1430, 1432 of the memory sled 1200 using a logical address space that maps to physical addresses in the memory sets 1430, 1432. The memory sled 1400 includes various components similar to components of the sled 400 and/or the compute sled 800, which have been identified in FIG. 14 using the same reference numbers. The description of such components provided above in regard to FIGS. 6, 7, and 8 apply to the corresponding components of the memory sled 1400 and is not repeated herein for clarity of the description of the memory sled 1400.

In the illustrative memory sled 1400, the physical resources 620 are embodied as memory controllers 1420. Although only two memory controllers 1420 are shown in FIG. 14, it should be appreciated that the memory sled 1400 may include additional memory controllers 1420 in other embodiments. The memory controllers 1420 may be embodied as any type of processor, controller, or control circuit capable of controlling the writing and reading of data into the memory sets 1430, 1432 based on requests received via the communication circuit 830. In the illustrative embodiment, each memory controller 1420 is connected to a corresponding memory set 1430, 1432 to write to and read from memory devices 720 within the corresponding memory set 1430, 1432 and enforce any permissions (e.g., read, write, etc.) associated with sled 400 that has sent a request to the memory sled 1400 to perform a memory access operation (e.g., read or write).

In some embodiments, the memory sled 1400 may also include a controller-to-controller interconnect 1442. Similar to the resource-to-resource interconnect 624 of the sled 400 discussed above, the controller-to-controller interconnect 1442 may be embodied as any type of communication interconnect capable of facilitating controller-to-controller communications. In the illustrative embodiment, the controller-to-controller interconnect 1442 is embodied as a high-speed point-to-point interconnect (e.g., faster than the I/O subsystem 622). For example, the controller-to-controller interconnect 1442 may be embodied as a QuickPath Interconnect (QPI), an UltraPath Interconnect (UPI), or other high-speed point-to-point interconnect dedicated to processor-to-processor communications. As such, in some embodiments, a memory controller 1420 may access, through the controller-to-controller interconnect 1442, memory that is within the memory set 1432 associated with another memory controller 1420. In some embodiments, a scalable memory controller is made of multiple smaller memory controllers, referred to herein as "chiplets", on a memory sled (e.g., the memory sled 1400). The chiplets may be interconnected (e.g., using EMIB (Embedded Multi-Die Interconnect Bridge)). The combined chiplet memory controller may scale up to a relatively large number of memory controllers and I/O ports, (e.g., up to 16 memory channels). In some embodiments, the memory controllers 1420 may implement a memory interleave (e.g., one memory address is mapped to the memory set 1430, the next memory address is mapped to the memory set 1432, and the third address is mapped to the memory set 1430, etc.). The interleaving may be managed within the memory controllers 1420, or from CPU sockets (e.g., of the compute sled 800) across network links to the memory sets 1430, 1432, and may improve the latency associated with performing memory access operations as compared to accessing contiguous memory addresses from the same memory device.

Further, in some embodiments, the memory sled 1400 may be connected to one or more other sleds 400 (e.g., in the same rack 240 or an adjacent rack 240) through a waveguide, using the waveguide connector 1480. In the illustrative embodiment, the waveguides are 64 millimeter waveguides that provide 16 Rx (i.e., receive) lanes and 16 Tx (i.e., transmit) lanes. Each lane, in the illustrative embodiment, is either 16 GHz or 32 GHz. In other embodiments, the frequencies may be different. Using a waveguide may provide high throughput access to the memory pool (e.g., the memory sets 1430, 1432) to another sled (e.g., a sled 400 in the same rack 240 or an adjacent rack 240 as the memory sled 1400) without adding to the load on the optical data connector 834.

Figure 15:
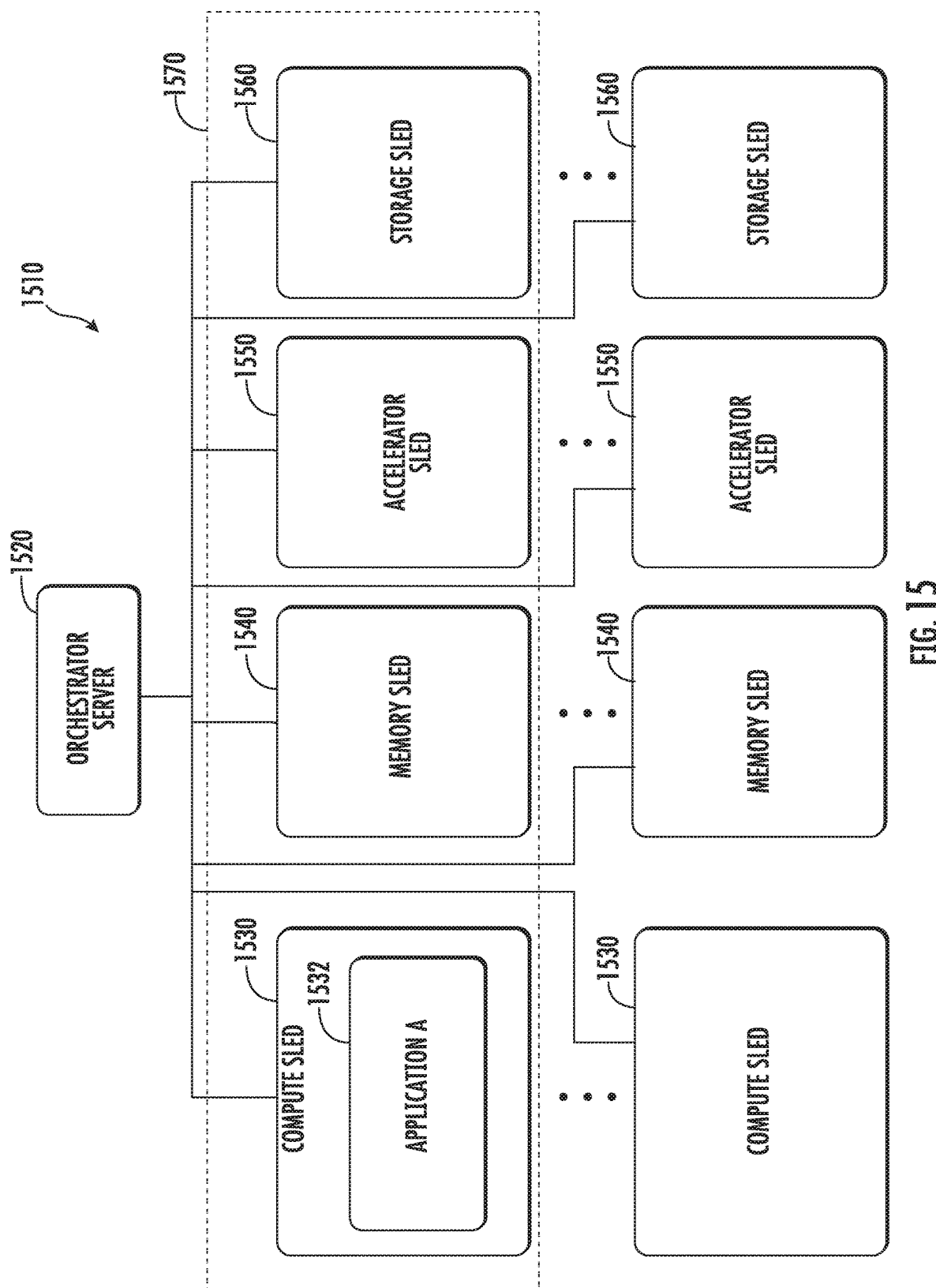
FIG. 15 is a simplified block diagram of a system that may be established within the data center of FIG. 1 to execute workloads with managed nodes composed of disaggregated resources.

Referring now to FIG. 15, a system for executing one or more workloads (e.g., applications) may be implemented in accordance with the data center 100. In the illustrative embodiment, the system 1510 includes an orchestrator server 1520, which may be embodied as a managed node comprising a compute device (e.g., a processor 820 on a compute sled 800) executing management software (e.g., a cloud operating environment, such as OpenStack) that is communicatively coupled to multiple sleds 400 including a large number of compute sleds 1530 (e.g., each similar to the compute sled 800), memory sleds 1540 (e.g., each similar to the memory sled 1400), accelerator sleds 1550 (e.g., each similar to the memory sled 1000), and storage sleds 1560 (e.g., each similar to the storage sled 1200). One or more of the sleds 1530, 1540, 1550, 1560 may be grouped into a managed node 1570, such as by the orchestrator server 1520, to collectively perform a workload (e.g., an application 1532 executed in a virtual machine or in a container). The managed node 1570 may be embodied as an assembly of physical resources 620, such as processors 820, memory resources 720, accelerator circuits 1020, or data storage 1250, from the same or different sleds 400. Further, the managed node may be established, defined, or "spun up" by the orchestrator server 1520 at the time a workload is to be assigned to the managed node or at any other time, and may exist regardless of whether any workloads are presently assigned to the managed node. In the illustrative embodiment, the orchestrator server 1520 may selectively allocate and/or deallocate physical resources 620 from the sleds 400 and/or add or remove one or more sleds 400 from the managed node 1570 as a function of quality of service (QoS) targets (e.g., performance targets associated with a throughput, latency, instructions per second, etc.) associated with a service level agreement for the workload (e.g., the application 1532). In doing so, the orchestrator server 1520 may receive telemetry data indicative of performance conditions (e.g., throughput, latency, instructions per second, etc.) in each sled 400 of the managed node 1570 and compare the telemetry data to the quality of service targets to determine whether the quality of service targets are being satisfied. The orchestrator server 1520 may additionally determine whether one or more physical resources may be deallocated from the managed node 1570 while still satisfying the QoS targets, thereby freeing up those physical resources for use in another managed node (e.g., to execute a different workload). Alternatively, if the QoS targets are not presently satisfied, the orchestrator server 1520 may determine to dynamically allocate additional physical resources to assist in the execution of the workload (e.g., the application 1532) while the workload is executing. Similarly, the orchestrator server 1520 may determine to dynamically deallocate physical resources from a managed node if the orchestrator server 1520 determines that deallocating the physical resource would result in QoS targets still being met.

Additionally, in some embodiments, the orchestrator server 1520 may identify trends in the resource utilization of the workload (e.g., the application 1532), such as by identifying phases of execution (e.g., time periods in which different operations, each having different resource utilizations characteristics, are performed) of the workload (e.g., the application 1532) and pre-emptively identifying available resources in the data center 100 and allocating them to the managed node 1570 (e.g., within a predefined time period of the associated phase beginning). In some embodiments, the orchestrator server 1520 may model performance based on various latencies and a distribution scheme to place workloads among compute sleds and other resources (e.g., accelerator sleds, memory sleds, storage sleds) in the data center 100. For example, the orchestrator server 1520 may utilize a model that accounts for the performance of resources on the sleds 400 (e.g., FPGA performance, memory access latency, etc.) and the performance (e.g., congestion, latency, bandwidth) of the path through the network to the resource (e.g., FPGA). As such, the orchestrator server 1520 may determine which resource(s) should be used with which workloads based on the total latency associated with each potential resource available in the data center 100 (e.g., the latency associated with the performance of the resource itself in addition to the latency associated with the path through the network between the compute sled executing the workload and the sled 400 on which the resource is located).

In some embodiments, the orchestrator server 1520 may generate a map of heat generation in the data center 100 using telemetry data (e.g., temperatures, fan speeds, etc.) reported from the sleds 400 and allocate resources to managed nodes as a function of the map of heat generation and predicted heat generation associated with different workloads, to maintain a target temperature and heat distribution in the data center 100. Additionally or alternatively, in some embodiments, the orchestrator server 1520 may organize received telemetry data into a hierarchical model that is indicative of a relationship between the managed nodes (e.g., a spatial relationship such as the physical locations of the resources of the managed nodes within the data center 100 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1520 may determine the differences based on the telemetry data stored in the hierarchical model and factor the differences into a prediction of future resource utilization of a workload if the workload is reassigned from one managed node to another managed node, to accurately balance resource utilization in the data center 100.

To reduce the computational load on the orchestrator server 1520 and the data transfer load on the network, in some embodiments, the orchestrator server 1520 may send self-test information to the sleds 400 to enable each sled 400 to locally (e.g., on the sled 400) determine whether telemetry data generated by the sled 400 satisfies one or more conditions (e.g., an available capacity that satisfies a predefined threshold, a temperature that satisfies a predefined threshold, etc.). Each sled 400 may then report back a simplified result (e.g., yes or no) to the orchestrator server 1520, which the orchestrator server 1520 may utilize in determining the allocation of resources to managed nodes.

Figure 16:
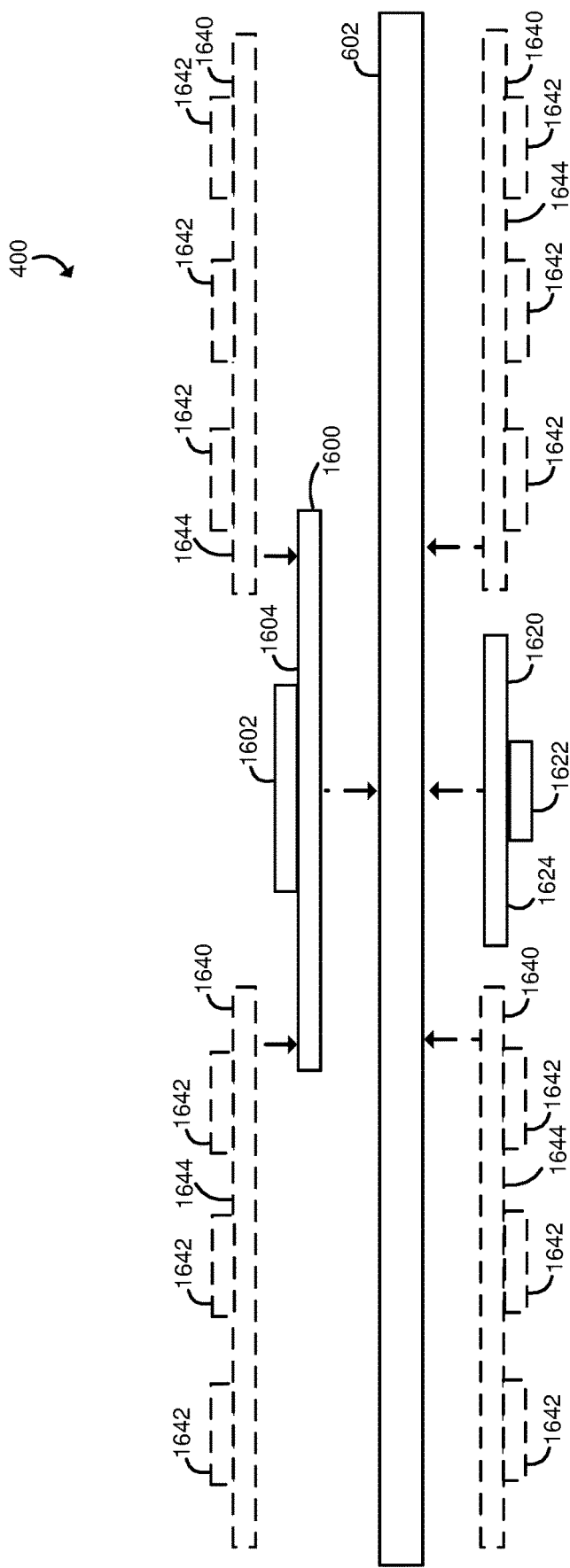
FIG. 16 is a simplified diagram of at least one embodiment of a sled usable in the data center of FIG. 1 and having physical resources mounted on one or more mezzanines.

Referring now to FIGS. 16-33, in some embodiments, one or more of the sleds 400 may include one or more of the physical resources (e.g., processors, memory, etc.) mounted on a mezzanine board, which is separate from but attached to the chassis-less circuit board substrate 602 via various mechanisms as discussed below. For example, as shown in FIG. 16, the illustrative sled 400 includes a processor mezzanine board 1600 having one or more processors 1602 (e.g., a processor 820) secured to a top side 1604 of the processor mezzanine board 1600 and a power mezzanine board 1620 having power circuitry devices 1622 secured to a top side 1624 of the power mezzanine board 1620. The illustrative sled 400 may also include one or more memory mezzanine boards 1640 having memory devices 1642 secured to a top side 1644 of the corresponding memory mezzanine board 1640. Depending on the particular configuration of the sled 400, the sled 400 may include one, some, or all of the processor mezzanine boards 1600, the power mezzanine boards 1620, and/or the memory mezzanine boards 1640.

Similarly to processor 820 described above, each of the processors 1602 may be embodied as any type of compute device or circuit capable of performing various tasks such as compute functions and/or controlling the functions of the sled 400 depending on, for example, the type or intended functionality of the sled 400. For example, as discussed in more detail below, the processors 1602 may be embodied as high-power processors in embodiments in which the sled 400 is embodied as a compute sled, as accelerator co-processors or circuits in embodiments in which the sled 400 is embodied as an accelerator sled, and/or storage controllers in embodiments in which the sled 400 is embodied as a storage sled. Again, depending on the type or intended functionality of the sled 400, the sled 400 may include one or more additional components, such as, but not limited to, a communication circuit having a network interface controller, physical resources in addition to those discussed above, an input/output (I/O) subsystem, a power connector, and one or more data storage drives.

The power circuitry devices 1622 may be embodied as, or otherwise include, any type of electronic components or devices for managing power. For example, in the illustrative embodiments, the power circuitry devices 1622 include voltage regulators and/or similar power control devices to supply a regulated power to the processors 1602 based on a supplied power.

Each of the memory devices 1642 may be embodied as any type of memory device capable of storing data for the processors 1602 during operation of the sled 400. For example, in the illustrative embodiments, the memory devices 1642 are embodied as dual in-line memory modules (DIMMs), which may support DDR, DDR2, DDR3, DDR4, or DDR5 random access memory (RAM). Of course, in other embodiments, the memory devices 1642 may utilize other memory technologies, including volatile and/or non-volatile memory. For example, types of volatile memory may include, but are not limited to, data rate synchronous dynamic RAM (DDR SDRAM), static random-access memory (SRAM), thyristor RAM (T-RAM) or zero-capacitor RAM (Z-RAM). Types of non-volatile memory may include byte or block addressable types of non-volatile memory. The byte or block addressable types of non-volatile memory may include, but are not limited to, 3-dimensional (3-D) cross-point memory, memory that uses chalcogenide phase change material (e.g., chalcogenide glass), multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

Each of the processor mezzanine boards 1600, the power mezzanine boards 1620, and the memory mezzanine boards 1640 may be formed from any suitable material capable of supporting the corresponding physical resources. For example, each of the processor mezzanine boards 1600, the power mezzanine boards 1620, and the memory mezzanine boards 1640 may be formed from a glass-reinforced epoxy laminate material such as FR-4. Of course, other materials may be used to form the mezzanine boards 1600, 1620, 1640.

In various embodiments, the power mezzanine board 1620 and/or the memory mezzanine board 1640 may be electrically coupled to a corresponding processor mezzanine board 1600 by vias established in the chassis-less circuit board substrate 602. To do so, one, some, or all of the processor mezzanine board 1600, the power mezzanine board 1620, and/or the memory mezzanine board 1640 may be soldered to the chassis-less circuit board substrate 602 (or to another mezzanine board as discussed below) with use of a ball grid array (BGA), a reflow grid array (RGA), a land grid array (LGA), or other grid array or connector. The use of BGA, RGA, and/or similar grid arrays supports package removal and replacement to address failures of corresponding components.

It should be appreciated that by moving physical resources from the chassis-less circuit board substrate 602 to dedicated mezzanine boards and using vias defined in the chassis-less circuit board substrate 602 to electrically connect the various mezzanine boards 1600, 1620, 1640 may reduce the use of large numbers of high-density, high speed traces on or within the chassis-less circuit board substrate 602. The mezzanine boards 1600, 1620, 1640 provides additional real-estate on the chassis-less circuit board substrate 602. By moving dedicated circuits to corresponding mezzanine boards (e.g., the power regulation circuitry to the power mezzanine board 1620 and the memory to the memory mezzanine board 1640), the corresponding mezzanine boards can be designed for the corresponding task. For example, the power mezzanine board 1620 can be designed with large traces to support increased power handling and, as such, may not require multi-layer floods. Additionally, the use of grid arrays (BGA, RGA, LGA, etc.) on the mezzanine boards 1600, 1620, 1640 allow for the corresponding landing pads (or connectors) to be defined on the chassis-less circuit board substrate 602 directly over or attached to a corresponding via through the chassis-less circuit board substrate 602, which reduces the need for any route break-outs.

It should be appreciated that the use of the grid arrays and vias reduces signal propagation distance and impedance between traces on the chassis-less circuit board substrate 602. With regard to the power mezzanine board 1620, this reduction in signal propagation distance and reduction in impedance may result in a reduction in wasted power and improve the power regulation response of the power circuitry devices 1622 to current changes (reduced inductance). With regard to the memory mezzanine boards 1640, the routing on the memory mezzanine board 1640 may be configured so as to improve cost and performance of the memory array (e.g., DRAM array), while reducing the signal distance to the corresponding processor 1602 without overly impeding the processor thermal solution.

Figure 17:
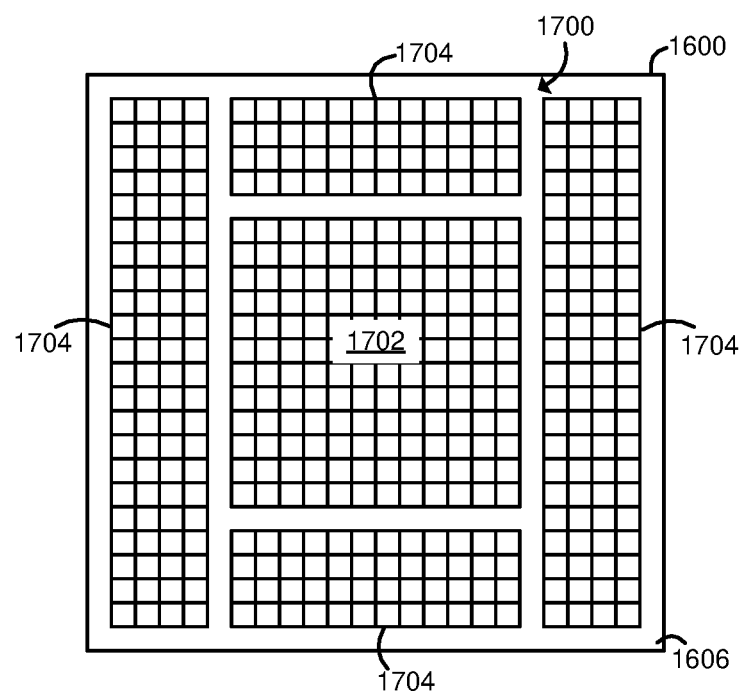
FIG. 17 is a bottom plan view of a simplified diagram of at least one embodiment of a processor of the sled of FIG. 16.

Referring now to FIG. 17, in the illustrative embodiment, the processor mezzanine board 1600 includes a grid array 1700 defined on a bottom side 1606 of the processor mezzanine board 1600. Illustratively, the grid array 1700 is embodied as a ball grid array (BGA), but may be embodied as a reflow grid array (RGA) or other type of grid array in other embodiments. The grid array 1700 includes a power grid array 1702 and multiple I/O grid arrays 1704. Each of the power grid array 1702 and the I/O grid arrays 1704 include an array of contact "balls" or other structures, depending on the type of grid array 1700. Additionally, the particular shape of the power grid array 1702 and the I/O grid array 1704 may be dependent on the particular implementation, the type of processor 1602, and/or other criteria. As discussed in more detail below, each "ball" or corresponding structure of the grid array 1700 is configured to contact and be soldered to a corresponding landing pad (or connector) of the chassis-less circuit board substrate 602 to electrically connect the processor mezzanine board 1600 to the chassis-less circuit board substrate 602. It should be appreciated that the "balls" of the power grid array 1202 and the "balls" of the I/O grid array 1704 may be separated from each other and may be of different sizes in some embodiments.

Figure 18:
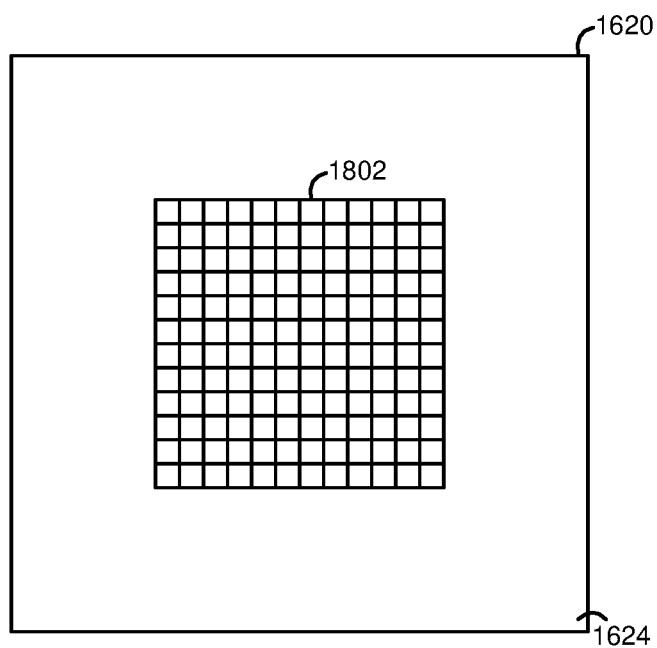
FIG. 18 is a bottom plan view of a simplified diagram of at least one embodiment of a power mezzanine of the sled of FIG. 16.

Similar to the processor mezzanine board 1600, the power mezzanine board 1620 includes a power grid array 1802 as shown in FIG. 18. Illustratively, the power grid array 1802 is embodied as a ball grid array (BGA), but may be embodied as a reflow grid array (RGA) or other type of grid array in other embodiments. The power grid array 1202 includes an array of contact "balls" or other structures, and is sized and arranged similar to the power grid array 1702 of the grid array 1700 of the processor mezzanine board 1600. The similar size and arrangement of the power grid arrays 1702, 1802 allow the power mezzanine board 1620 to be electrically coupled to the processor mezzanine board 1600 by corresponding vias, without the need of additional traces or routing on the chassis-less circuit board substrate 602 as described in more detail below.

Figure 19:
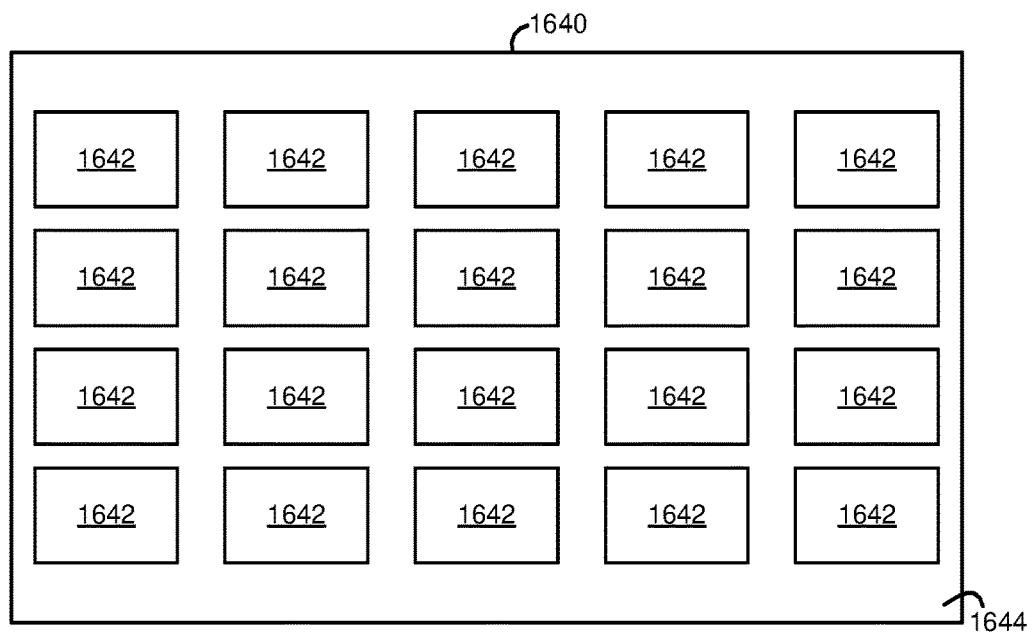
FIG. 19 is a top plan view of a simplified diagram of at least one embodiment of a memory mezzanine of the sled of FIG. 16.
Figure 20:
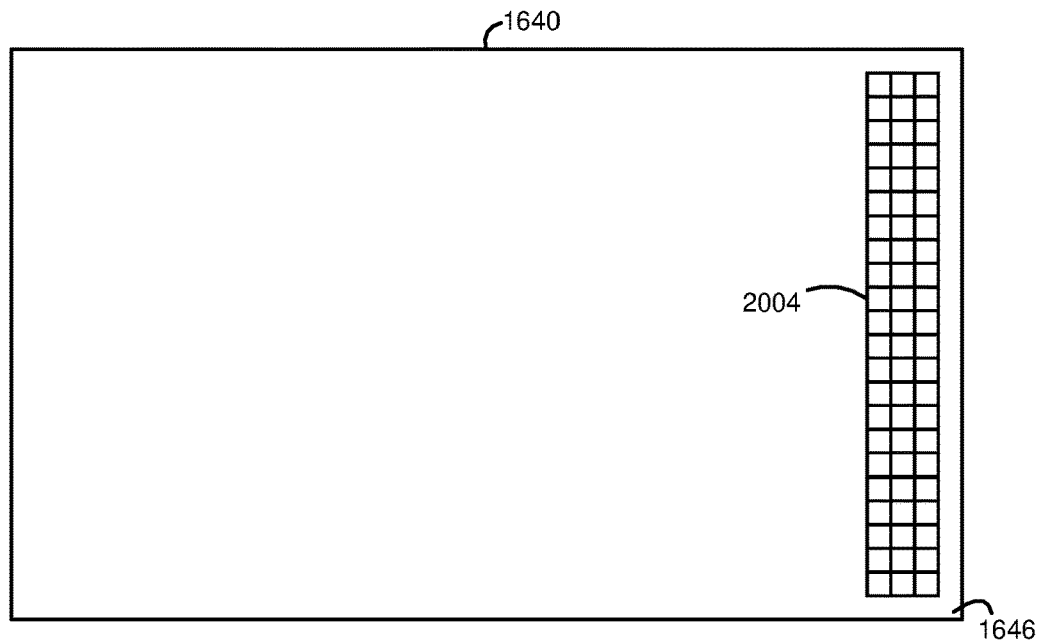
FIG. 20 is a bottom plan view of the memory mezzanine of FIG. 19.

Referring now to FIGS. 19 and 20, as discussed above, the memory mezzanine board 1640 include a one or more memory devices 1642 (e.g., DRAM memory modules) coupled to the top side 1644 of the memory mezzanine board 1640. The particular type and number of memory devices or modules included on the memory mezzanine board 1640 may depend on the particular implementation, the desired amount of memory, the type of corresponding processor 1602, and/or other criteria. The memory mezzanine board 1640 also includes an I/O grid array 2004 defined on a bottom side 1646 of the memory mezzanine board 1640. Illustratively, the I/O grid array 1802 is embodied as a ball grid array (BGA), but may be embodied as a reflow grid array (RGA) or other type of grid array in other embodiments. The I/O grid array 2004 includes an array of contact "balls" or other structures, and is sized and arranged similar to the I/O grid array 1704 of the grid array 1700 of the processor mezzanine board 1600. The similar size and arrangement of the I/O grid arrays 2004, 1704 allow the memory mezzanine board 1640 to be electrically coupled to the processor mezzanine board 1600 by corresponding vias, without the need of additional traces or routing on the chassis-less circuit board substrate 602 as described in more detail below.

Figure 21:
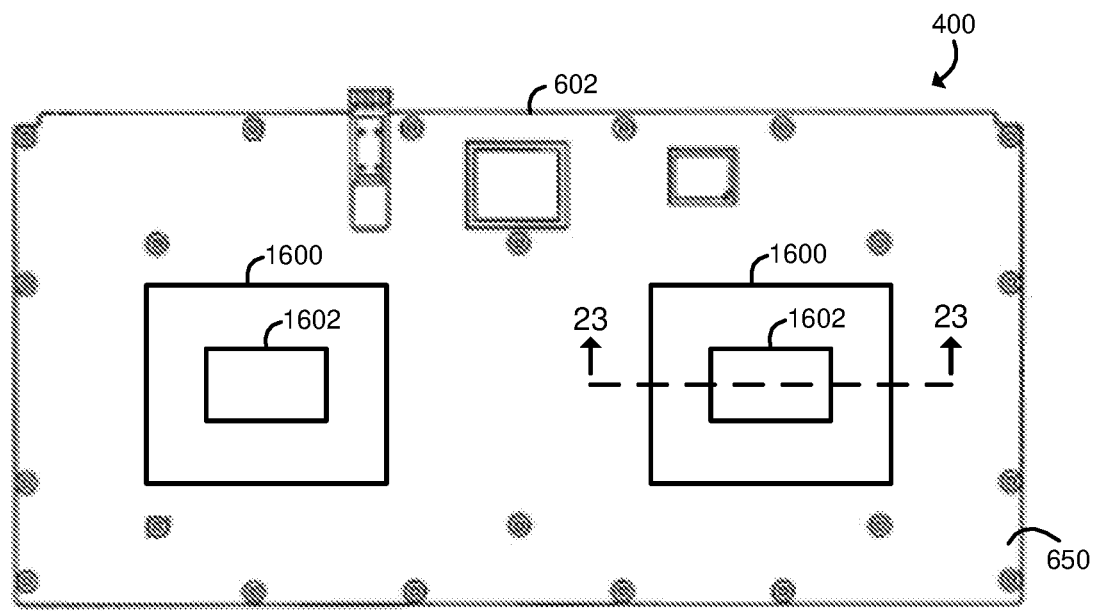
FIG. 21 is a top plan view of at least one embodiment of a sled usable in the data center of FIG. 1.
Figure 22:
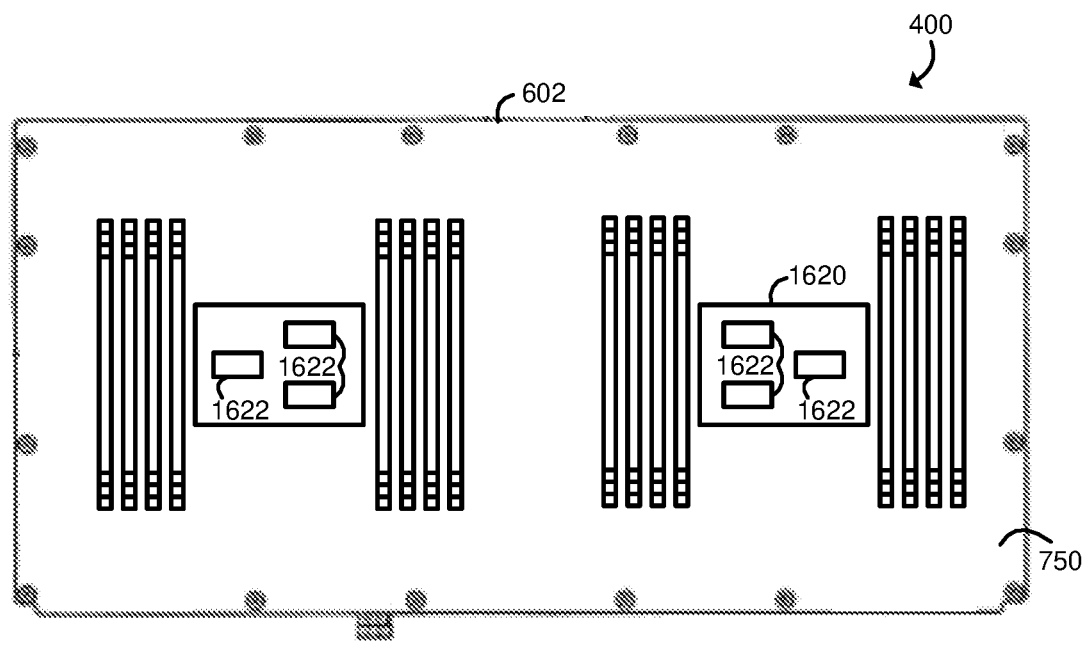
FIG. 22 is a bottom plan view of the sled of FIG. 21.
Figure 23:
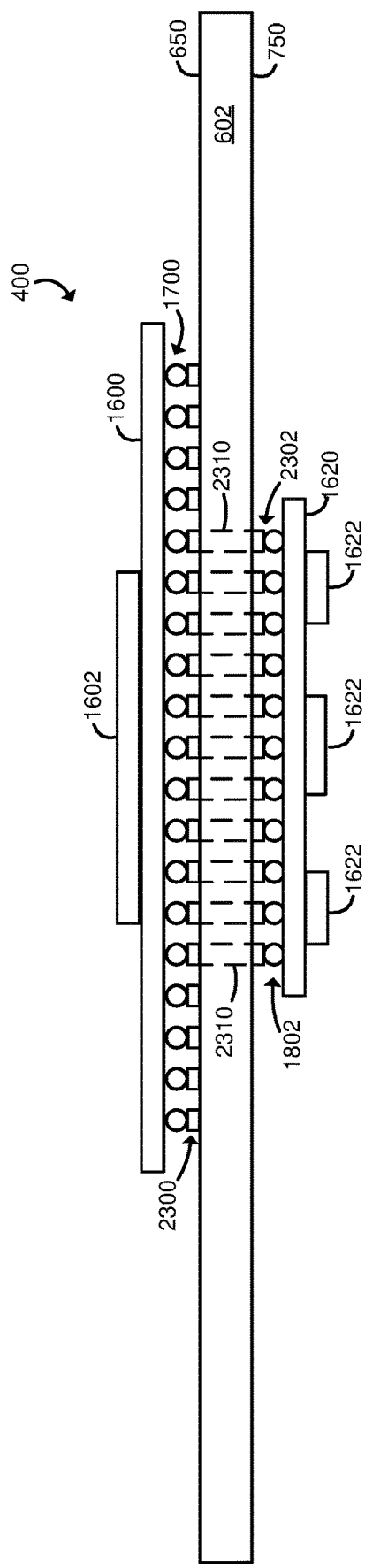
FIG. 23 is a cross-sectional view of the sled of FIGS. 21 and 22 taken generally along the lines 23-23.

Referring now to FIGS. 21-23, in an illustrative embodiment, the sled 400 includes a pair of processor mezzanine boards 1600 mounted to the top side 650 of the chassis-less circuit board substrate 602 and corresponding power mezzanine boards 1620 mounted to the bottom side 750 of the chassis-less circuit board substrate 602. To do so, as shown in FIG. 23, the grid array 1700 of the processor mezzanine board 1600 is electrically connected (e.g., soldered) to a landing pad array 2300 defined on the top side 650 of the chassis-less circuit board substrate 602. That is, each "ball" or other structure of the grid array 1700 is soldered to a corresponding land pad of the landing pad array 2300. Any suitable soldering process may be used to electrically connect the grid array 1700 to the landing pad array 2300.

Each landing pad (or other connector) of the landing pad array 2300 electrically connected to the power grid array 1702 of the grid array 1700 is also electrically connected to a via 2310 defined through the chassis-less circuit board substrate 602. Each via 2310 is also electrically connected to a corresponding landing pad of a landing pad array 2302 defined on the bottom side 750 of the chassis-less circuit board substrate 602. Additionally, the power grid array 1802 of the power mezzanine board 1620 is electrically connected to the landing pad array 2302. That is, each "ball" or other structure of the grid array 1700 is soldered to a corresponding land pad of the landing pad array 2302. Any suitable soldering process may be used to electrically connect the grid array 1802 to the landing pad array 2302.

It should be appreciated that each of the vias 2310 defined through the the chassis-less circuit board substrate 602 may include connectors embedded therein. Such connectors may be embodied as any type of connector capable of facilitating electrical connection including, but not limited to pogo pins, a beryllium-copper (BECU) coils, and conductive elastomers.

In use, the power circuitry devices 1622 of the power mezzanine board 1620 regulate and provide power to the processor 1602. The power is provided directly to the processor 1602 through the grid array 1802, the landing pad array 2302, the vias 2310, the landing pad array 2300, and the grid array 1700. In this way, the power regulation devices are segregated to the power mezzanine board 1620 and the power path is reduced, which may reduce noise, improve power delivery, and improve power efficiency.

Figure 24:
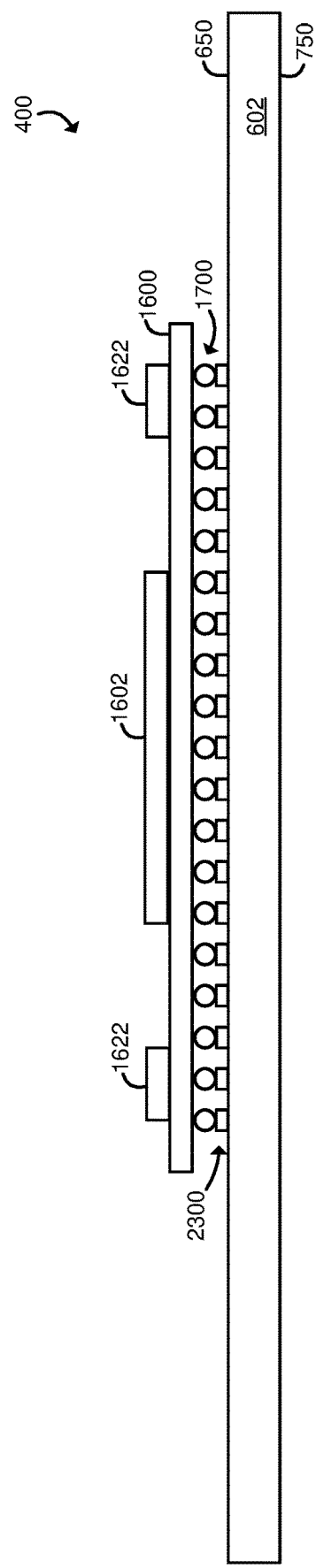
FIG. 24 is a cross-sectional view of another embodiment of the sled of FIGS. 21 and 22 taken generally along the lines 23-23.

In some embodiments, as shown in FIG. 24, the power circuitry devices 1622 may be located on the processor mezzanine board 1600 itself. In such embodiments, the sled 400 may not include the power mezzanine board 1620. The power circuitry devices 1622 may regulate and provide power to the processor 1602 via traces define on or in the processor mezzanine board 1600.

Figure 25:
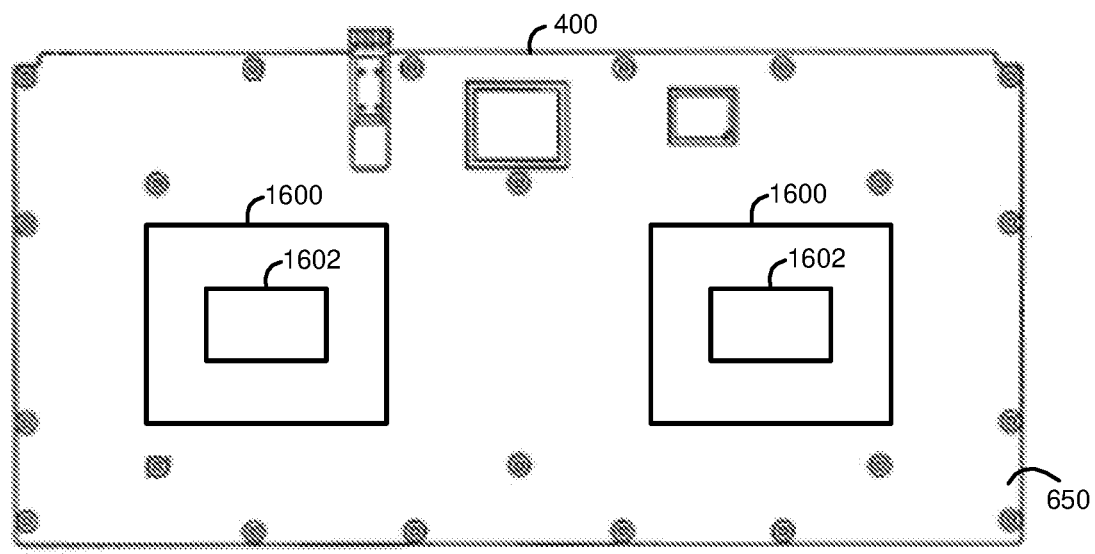
FIG. 25 is a top plan view of another embodiment of a sled usable in the data center of FIG. 1.
Figure 26:
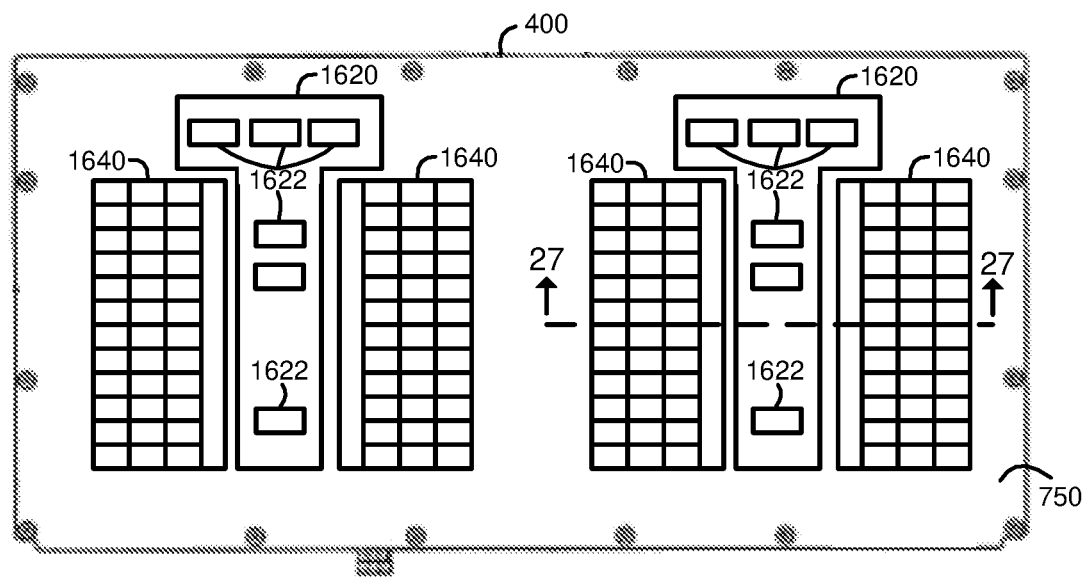
FIG. 26 is a bottom plan view of the sled of FIG. 25.
Figure 27:
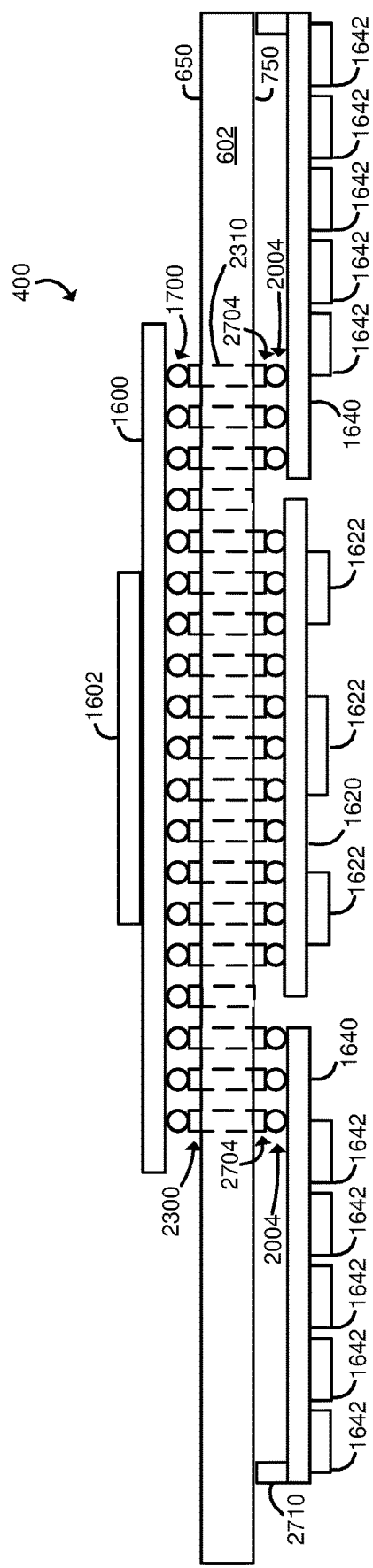
FIG. 27 is a cross-sectional view of the sled of FIGS. 25 and 26 taken generally along the lines 27-27.

Referring now to FIGS. 25-27, in an illustrative embodiment, the sled 400 includes a pair of processor mezzanine boards 1600 mounted to the top side 650 of the chassis-less circuit board substrate 602 and corresponding power mezzanine boards 1620 and memory mezzanine boards 1640 mounted to the bottom side 750 of the chassis-less circuit board substrate 602. It should be appreciated that in the illustrative embodiment of FIGS. 25-27, the power mezzanine board 1620 has a "T"-shaped top profile to accommodate a memory mezzanine board 1640 on either side of the power mezzanine board 1620. The "T"-shape of the power mezzanine board 1620 provides additional surface area at the top cross of the "T"-shape to mount additional power circuitry devices 1622.

As shown in FIG. 27, the grid array 1700 of the processor mezzanine board 1600 is electrically connected (e.g., soldered) to the landing pad array 2300 defined on the top side 650 of the chassis-less circuit board substrate 602. That is, each "ball" or other structure of the grid array 1700 is soldered to a corresponding land pad of the landing pad array 2300. As discussed above in regard to FIG. 23, each landing pad (or other connector) of the landing pad array 2300 that is electrically connected to a "ball" of the power grid array 1702 of the grid array 1700 is electrically connected to a landing pad of the landing pad array 2302 (see FIG. 23) by a corresponding via 2310. The power grid array 1802 of the power mezzanine board 1620 is electrically connected to the landing pad array 2302 (see FIG. 23). That is, each "ball" or other structure of the grid array 1700 is soldered to a corresponding land pad of the landing pad array 2302.

Additionally, as shown in FIG. 27, each landing pad (or other connector) of the landing pad array 2300 that is electrically connected to a "ball" of the I/O grid array 1704 of the grid array 1700 of the processor mezzanine board 1600 is electrically connected to a corresponding landing pad of a landing pad array 2704 defined on the bottom side 750 of the chassis-less circuit board substrate 602 by a corresponding via 2310 defined through the chassis-less circuit board substrate 602. Additionally, the I/O grid array 2004 of the corresponding memory mezzanine board 1640 is electrically connected to the landing pad array 2704. That is, each "ball" or other structure of the I/O grid array 2004 is soldered to a corresponding landing pad of the landing pad array 2704. Any suitable soldering process may be used to electrically connect the I/O grid array 2004 to the landing pad array 2704. In some embodiments, a distal lateral side of each memory mezzanine board 1640 may be supported by a support 2710, which may be secured to the chassis-less circuit board substrate 602 (e.g., via solder) to reduce levering of the memory mezzanine board 1640. It should be appreciated that the flat or horizontal positioning of the memory mezzanine board 1640, relative to a typical vertical positioning, may allow for better cooling or overall performance of the memory devices 1642.

In use, the processor 1602 may access the memory devices 1642 of the memory mezzanine board 1640 through the grid array 1700, the landing pad array 2300, the vias 2310, the landing pad array 2704, and the I/O grid array 2004 of the memory mezzanine board 1640. In this way, the signal traces and path are segregated onto the memory mezzanine board, which may improve signal noise and losses.

Figure 28:
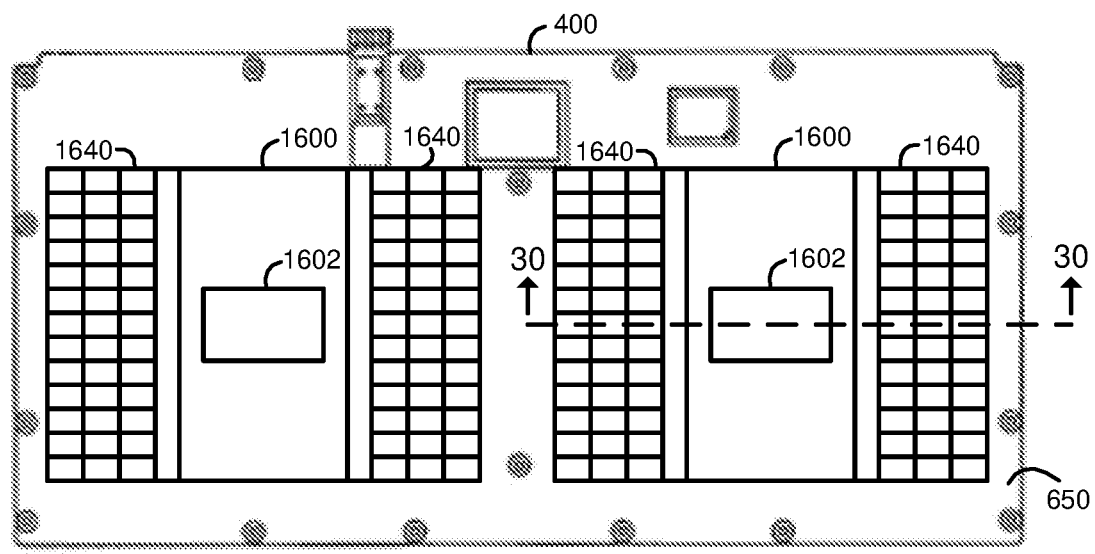
FIG. 28 is a top plan view of another embodiment of a sled usable in the data center of FIG. 1.
Figure 29:
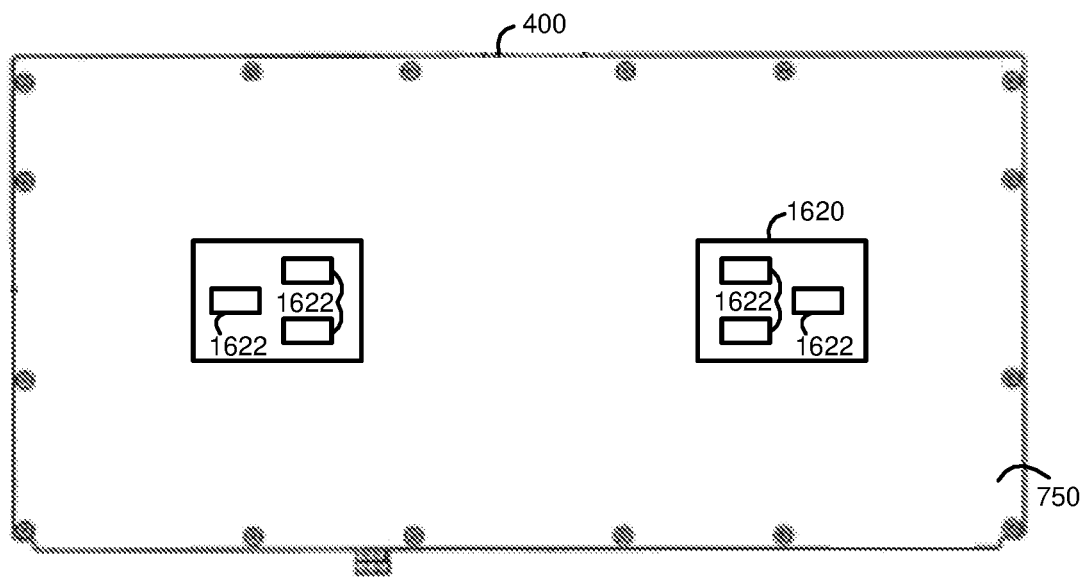
FIG. 29 is a bottom plan view of the sled of FIG. 28.
Figure 30:
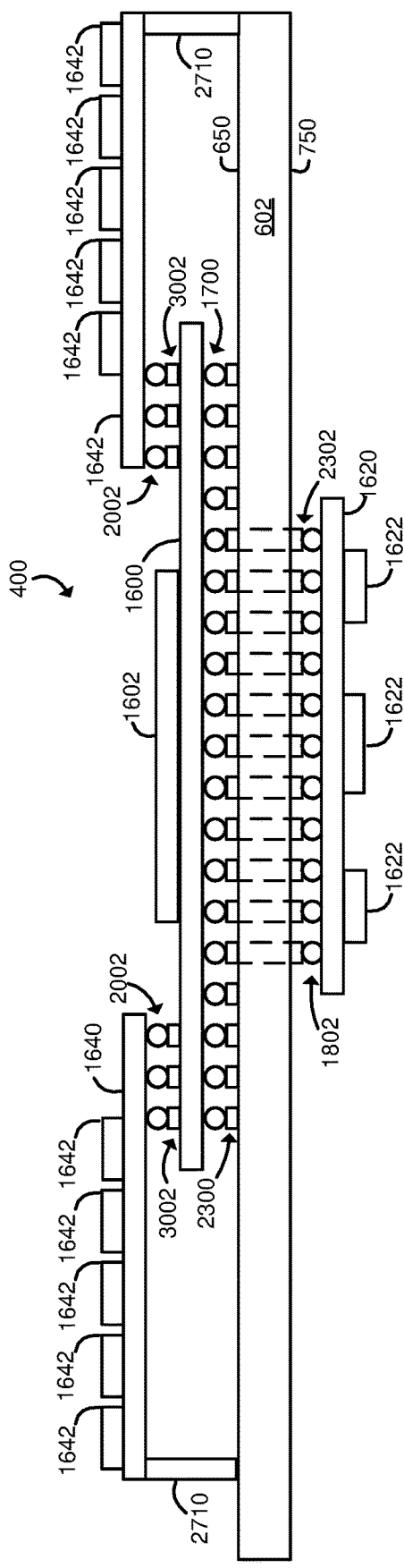
FIG. 30 is a cross-sectional view of the sled of FIGS. 28 and 29 taken generally along the lines 30-30.

Referring now to FIGS. 28-30, in an illustrative embodiment, the sled 400 includes a pair of processor mezzanine boards 1600 mounted to the top side 650 of the chassis-less circuit board substrate 602, a pair of memory mezzanine boards 1640 mounted to each processor mezzanine board 1600 on the top side 650 of the chassis-less circuit board substrate 602, and corresponding power mezzanine boards 1620 mounted to the bottom side 750 of the chassis-less circuit board substrate 602. To do so, as shown in FIG. 30, the grid array 1700 of the processor mezzanine board 1600 is electrically connected (e.g., soldered) to the landing pad array 2300 defined on the top side 650 of the chassis-less circuit board substrate 602. That is, each "ball" or other structure of the grid array 1700 is soldered to a corresponding land pad of the landing pad array 2300. As discussed above, any suitable soldering process may be used to electrically connect the grid array 1700 to the landing pad array 2300.

Each landing pad (or other connector) of the landing pad array 2300 that is electrically connected to the power grid array 1702 of the grid array 1700 is also electrically connected to a via 2310 defined through the chassis-less circuit board substrate 602. Each via 2310 is also electrically connected to a corresponding landing pad of the landing pad array 2302 defined on the bottom side 750 of the chassis-less circuit board substrate 602. Additionally, the power grid array 1802 of the power mezzanine board 1620 is electrically connected to the landing pad array 2302. That is, each "ball" or other structure of the grid array 1700 is soldered to a corresponding land pad of the landing pad array 2302.

Again, any suitable soldering process may be used to electrically connect the grid array 1802 to the landing pad array 2302.

The processor mezzanine board 1600 also includes a pair of landing pad arrays 3000 defined on the top side 1604 and toward a corresponding lateral side of the processor mezzanine board 1600. The I/O grid array 2002 of a corresponding memory mezzanine board 1620 is electrically secured (e.g., soldered) to each landing pad array 3000. That is, each "ball" or other structure of the I/O grid array 2002 is soldered to a corresponding land pad of the landing pad array 3002. Again, any suitable soldering process may be used to electrically connect the I/O grid array 2002 to the landing pad array 3002.

Figure 31:
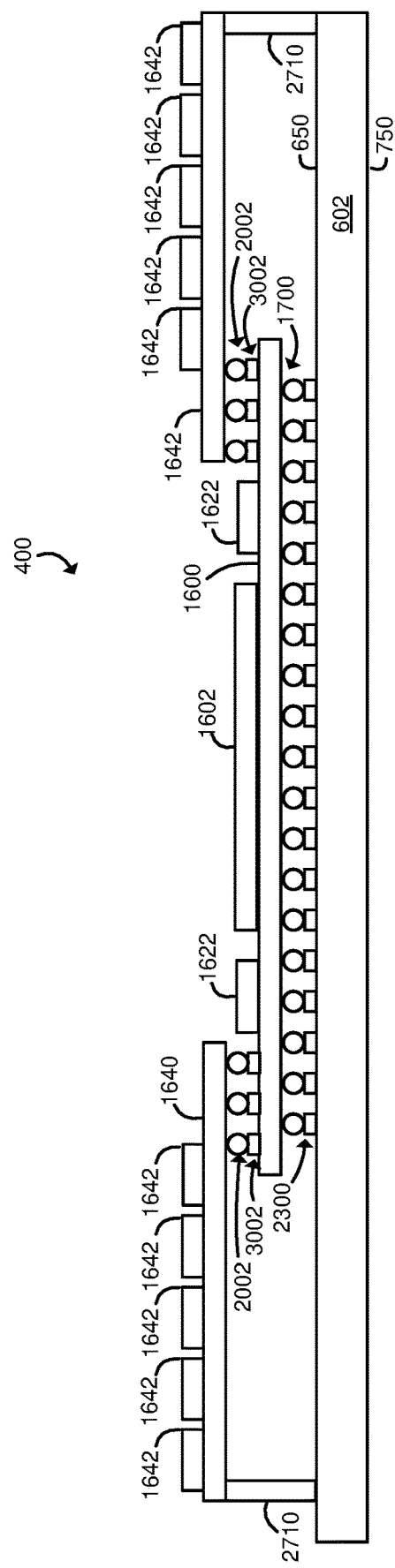
FIG. 31 is a cross-sectional view of another embodiment of the sled of FIGS. 28 and 29 taken generally along the lines 30-30.

In some embodiments, as shown in FIG. 31, the power circuitry devices 1622 may be located on the processor mezzanine board 1600 itself. In such embodiments, the sled 400 may not include the power mezzanine board 1620. The power circuitry devices 1622 may regulate and provide power to the processor 1602 via traces define on or in the processor mezzanine board 1600.

Figure 32:
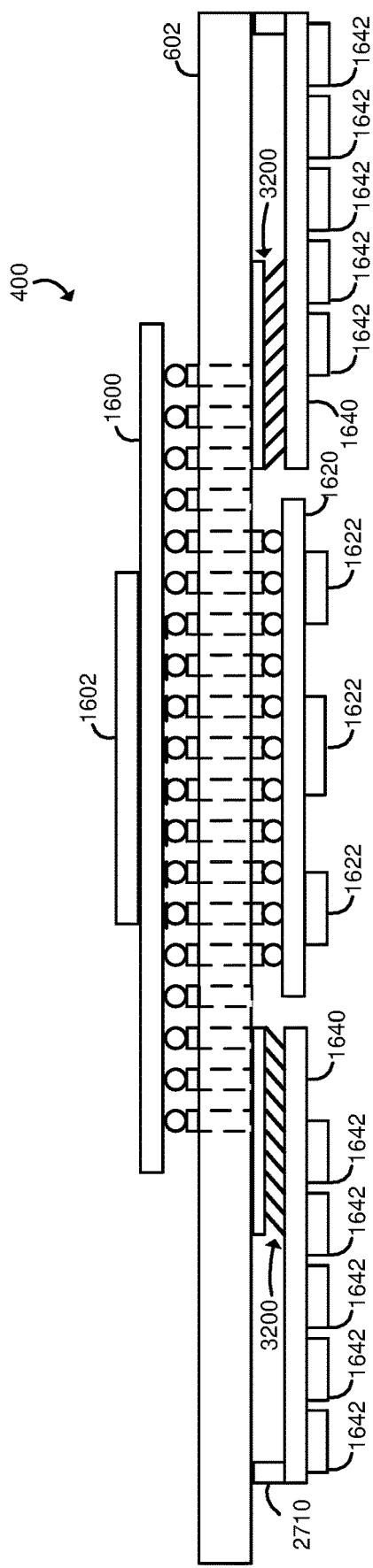
FIG. 32 is a cross-sectional view of another embodiment of the sled of FIG. 27.
Figure 33:
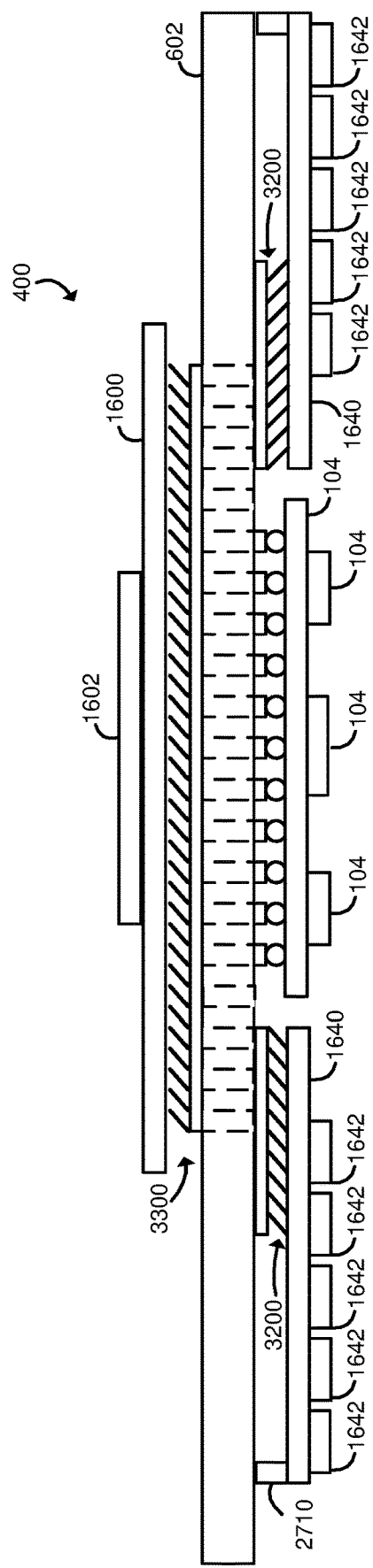
FIG. 33 is a cross-sectional view of another embodiment of the sled of FIG. 27.

Referring now to FIGS. 32 and 33, in some embodiments some or all of the grid arrays 1700, 1802, 2004 may be embodied as land grid arrays (LGA) rather than ball grid arrays (BGA) or reflow grid arrays (RGA). For example, as shown in FIG. 32, each of the memory mezzanine boards 1640 may be coupled to the chassis-less circuit board substrate 602 via a LGA 3200. Additionally or alternatively, the processor mezzanine board 1600 may be coupled to the chassis-less circuit board substrate 602 via a LGA 3300 as shown in FIG. 33.

EXAMPLES

Illustrative examples of the technologies disclosed herein are provided below. An embodiment of the technologies may include any one or more, and any combination of, the examples described below.

Example 1 includes a sled, the sled comprising a circuit board substrate having a top side and a bottom side opposite the top side; a processor coupled to the top side of the circuit board substrate; a power mezzanine board coupled to the bottom side of the circuit board substrate; and a connector to electrically couple the physical resource to the power mezzanine board, wherein the connector extends through the circuit board substrate to the top and bottom sides thereof, and wherein the connector comprises (i) a first contact accessible from the top side of the circuit board substrate and mated with a corresponding contact of the physical resource and (ii) a second contact, opposite the first contact, accessible from the bottom side of the circuit board substrate and mated with a corresponding contact of the power mezzanine board.

Example 2 includes a sled, the sled comprising a circuit board substrate having a top side and a bottom side opposite the top side; a processor coupled to the top side of the circuit board substrate; a memory mezzanine board coupled to the bottom side of the circuit board substrate; and a connector to electrically couple the physical resource to the memory mezzanine board, wherein the connector extends through the circuit board substrate to the top and bottom sides thereof, and wherein the connector comprises (i) a first contact accessible from the top side of the circuit board substrate and mated with a corresponding contact of the physical resource and (ii) a second contact, opposite the first contact, accessible from the bottom side of the circuit board substrate and mated with a corresponding contact of the memory mezzanine board.

Example 3 includes the subject matter of Example 2, and wherein the memory mezzanine board is soldered to the circuit board substrate through a ball grid array.

Example 4 includes the subject matter of any of Examples 2 and 3, and wherein the memory mezzanine board is bonded to the circuit board substrate.

Example 5 includes the subject matter of any of Examples 2-4, and wherein the connector comprises a pogo pin.

Example 6 includes the subject matter of any of Examples 2-5, and wherein the connector comprises a beryllium-copper coil.

Example 7 includes the subject matter of any of Examples 2-6, and wherein the connector comprises a conductive elastomer.

Example 8 includes the subject matter of any of Examples 2-7, and wherein the connector comprises a first land grid array mated with the processor and a second land grid array mated with the memory mezzanine board.

Example 9 includes the subject matter of any of Examples 2-8, and wherein the connector comprises a ball grid array mated with the processor and a land grid array mated with the memory mezzanine board.

Example 10 includes a sled, the sled comprising a circuit board substrate having a top side and a bottom side opposite the top side; a processor coupled to the top side of the circuit board substrate, wherein the processor has a top side and a bottom side opposite the top side; and a memory mezzanine board coupled to the top side of the processor.

Example 11 includes the subject matter of Example 10, and wherein the memory mezzanine board is soldered to the top side of the processor by a ball grid array.

The invention claimed is:
1. A sled, the sled comprising:
a circuit board substrate having a top side and a bottom side opposite the top side;
a processor mezzanine board having a top side and a bottom side, wherein the processor mezzanine board includes a first electrical contact and a second electrical contact located on the bottom side of the processor mezzanine board;
a processor coupled to the top side of the processor mezzanine board and electrically coupled to the electrical contact of the processor mezzanine board;
a power mezzanine board having a top side and a bottom side, wherein the power mezzanine board includes (i) an electrical contact located on the top side of the power mezzanine board and (ii) power circuitry devices coupled to the bottom side of the power mezzanine board and electrically coupled to the electrical contact of the power mezzanine board;
a first connector to electrically couple the power circuitry devices to the processor, wherein the connector extends through the circuit board substrate to the top and bottom sides thereof, and wherein the first connector comprises (i) a first contact accessible from the top side of the circuit board substrate and electrically connected with the first electrical contact located on the bottom side of the processor mezzanine board and (ii) a second contact, opposite the first contact of the first connector, accessible from the bottom side of the circuit board substrate and electrically connected with the electrical contact located on the top side of the power mezzanine board;

a memory mezzanine board having a top side and a bottom side, wherein the memory mezzanine board includes (i) an electrical contact located on the top side of the memory mezzanine board and (ii) a memory device coupled to the bottom side of the memory mezzanine board and electrically coupled to the electrical contact of the memory mezzanine board; and a second connector to electrically couple the memory device of the memory mezzanine board to the processor, wherein the second connector extends through the circuit board substrate to the top and bottom sides thereof, and wherein the second connector comprises (i) a first contact accessible from the top side of the circuit board substrate and electrically connected with the second electrical connector located on the bottom side of the processor mezzanine board and (ii) a second contact, opposite the first contact of the second connector, accessible from the bottom side of the circuit board substrate and electrically connected with the electrical connector located on the top side of the memory mezzanine board.

2. The sled of claim 1, wherein the memory mezzanine board comprises a first memory mezzanine board and the processor mezzanine board includes a third electrical contact located on the bottom side of the processor mezzanine board, and further comprising:

a second memory mezzanine board having a top side and a bottom side, wherein the second memory mezzanine board includes (i) an electrical contact located on the top side of the second memory mezzanine board and (ii) a memory device coupled to the bottom side of the second memory mezzanine board and electrically coupled to the electrical contact of the second memory mezzanine board; and a third connector to electrically couple the memory device of the second memory mezzanine board to the processor, wherein the third connector extends through the circuit board substrate to the top and bottom sides thereof, and wherein the third connector comprises (i) a first contact accessible from the top side of the circuit board substrate and electrically connected with the third electrical connector located on the bottom side of the processor mezzanine board and (ii) a second contact, opposite the first contact of the third connector, accessible from the bottom side of the circuit board substrate and electrically connected with the electrical connector located on the top side of the second memory mezzanine board.

3. The sled of claim 2, wherein the power mezzanine board is located on the bottom side of the circuit board substrate between the first memory mezzanine board and the second memory mezzanine board.

4. The sled of claim 3, wherein the power mezzanine board is T-shaped.

5. The sled of claim 1, wherein the processor comprises a first processor, the processor mezzanine board comprises a first processor mezzanine board, and the connector comprises a first connector, and further comprising:

a second processor mezzanine board having a top side and a bottom side, wherein the second processor mezzanine board includes an electrical contact on the bottom side of the second processor mezzanine board;

a second processor coupled to the top side of the second processor mezzanine board and electrically coupled to the electrical contact of the second processor mezzanine board;

a second power mezzanine board having a top side and a bottom side, wherein the second power mezzanine board includes (i) an electrical contact located on the top side of the second power mezzanine board and (ii) power circuitry devices coupled to the bottom side of the second power mezzanine board and electrically coupled to the electrical contact of the second power mezzanine board; and a second connector to electrically couple the power circuitry devices of the second power mezzanine board to the second processor, wherein the second connector extends through the circuit board substrate to the top and bottom sides thereof, and wherein the second connector comprises (i) a first contact accessible from the top side of the circuit board substrate and electrically connected with the first electrical contact located on the bottom side of the second processor mezzanine board and (ii) a second contact, opposite the first contact of the second connector, accessible from the bottom side of the circuit board substrate and electrically connected with the electrical contact located on the top side of the second power mezzanine board.

6. The sled of claim 1, wherein the connector comprises a first connector, the electrical contact of the processor mezzanine board comprises a first electrical contact, and the processor mezzanine board includes a second electrical contact located on the top side of the processor mezzanine board, and further comprising:

a memory mezzanine board having a top side and a bottom side, wherein the memory mezzanine board includes (i) an electrical contact located on the bottom side of the memory mezzanine board and (ii) a memory device coupled to the top side of the memory mezzanine board and electrically coupled to the electrical contact of the memory mezzanine board, wherein the electrical contact of the memory mezzanine board is electrically connected with the second electrical contact located on the top side of the processor mezzanine board.

7. The sled of claim 6, wherein the memory mezzanine comprises a first memory mezzanine and the processor mezzanine board includes a third electrical contact located on the top side of the processor mezzanine board, and further comprising:

a second memory mezzanine board having a top side and a bottom side, wherein the second memory mezzanine board includes (i) an electrical contact located on the bottom side of the second memory mezzanine board and (ii) a memory device coupled to the top side of the second memory mezzanine board and electrically coupled to the electrical contact of the second memory mezzanine board, wherein the electrical contact of the second memory mezzanine board is electrically connected with the third electrical contact located on the top side of the processor mezzanine board.

8. The sled of claim 1, wherein the power mezzanine board has a smaller physical footprint than the physical footprint of the processor mezzanine board.

9. A sled, the sled comprising:
a circuit board substrate having a top side and a bottom side opposite the top side;
a processor mezzanine board having a top side and a bottom side, wherein the processor mezzanine board includes a first electrical contact and a second electrical contact located on the bottom side of the processor mezzanine board;

a processor coupled to the top side of the processor mezzanine board and electrically coupled to the electrical contact of the processor mezzanine board;

a first memory mezzanine board having a top side and a bottom side, wherein the first memory mezzanine board includes (i) an electrical contact located on the top side of the first memory mezzanine board and (ii) a memory device coupled to the bottom side of the first memory mezzanine board and electrically coupled to the electrical contact of the first memory mezzanine board;

a first connector to electrically couple the memory device to the processor, wherein the first connector extends through the circuit board substrate to the top and bottom sides thereof, and wherein the first connector comprises (i) a first contact accessible from the top side of the circuit board substrate and electrically connected with the electrical connector located on the bottom side of the processor mezzanine board and (ii) a second contact, opposite the first contact of the first connector, accessible from the bottom side of the circuit board substrate and electrically connected with the electrical connector located on the top side of the first memory mezzanine board;

a second memory mezzanine board having a top side and a bottom side, wherein the second memory mezzanine board includes (i) an electrical contact located on the top side of the second memory mezzanine board and (ii) a memory device coupled to the bottom side of the second memory mezzanine board and electrically coupled to the electrical contact of the second memory mezzanine board; and a second connector to electrically couple the memory device to the processor, wherein the second connector extends through the circuit board substrate to the top and bottom sides thereof, and wherein the second connector comprises (i) a first contact accessible from the top side of the circuit board substrate and electrically connected with the second electrical connector located on the bottom side of the processor mezzanine board and (ii) a second contact, opposite the first contact of the second connector, accessible from the bottom side of the circuit board substrate and electrically connected with the electrical connector located on the top side of the second memory mezzanine board.

10. The sled of claim 9, wherein the memory mezzanine board is soldered to the circuit board substrate through a ball grid array.

11. The sled of claim 9, wherein the memory mezzanine board is bonded to the circuit board substrate.

12. The sled of claim 9, wherein the connector comprises a pogo pin.

13. The sled of claim 9, wherein the connector comprises a beryllium-copper coil.

14. The sled of claim 9, wherein the connector comprises a conductive elastomer.

15. The sled of claim 9, wherein the connector comprises a first land grid array mated with the processor and a second land grid array mated with the memory mezzanine board.

16. The sled of claim 9, wherein the connector comprises a ball grid array mated with the processor and a land grid array mated with the memory mezzanine board.

17. The sled of claim 9, wherein at least a first portion of the processor mezzanine board is positioned vertically above at least a portion of the first memory mezzanine board, and wherein at least a second portion of the processor mezzanine board is positioned vertically above at least a portion of the second memory mezzanine board.

18. A sled, the sled comprising:
a circuit board substrate having a top side and a bottom side opposite the top side;

a first processor mezzanine board having a top side and a bottom side, wherein the first processor mezzanine board includes a first electrical contact and a second electrical contact located on the bottom side of the first processor mezzanine board;

a first processor coupled to the top side of the first processor mezzanine board and electrically coupled to the first and second electrical contacts of the first processor mezzanine board;

a second processor mezzanine board having a top side and a bottom side, wherein the second processor mezzanine board includes a first electrical contact and a second electrical contact located on the bottom side of the second processor mezzanine board;

a second processor coupled to the top side of the second processor mezzanine board and electrically coupled to the first and second electrical contacts of the second processor mezzanine board;

a first power mezzanine board having a top side and a bottom side, wherein the first power mezzanine board includes (i) an electrical contact located on the top side of the first power mezzanine board and (ii) power circuitry devices coupled to the bottom side of the first power mezzanine board and electrically coupled to the electrical contact of the first power mezzanine board;

a second power mezzanine board having a top side and a bottom side, wherein the second power mezzanine board includes (i) an electrical contact located on the top side of the second power mezzanine board and (ii) power circuitry devices coupled to the bottom side of the second power mezzanine board and electrically coupled to the electrical contact of the second power mezzanine board;

a first memory mezzanine board having a top side and a bottom side, wherein the first memory mezzanine board includes (i) an electrical contact located on the top side of the first memory mezzanine board and (ii) a memory device coupled to the bottom side of the first memory mezzanine board and electrically coupled to the electrical contact of the first memory mezzanine board;

a second memory mezzanine board having a top side and a bottom side, wherein the second memory mezzanine board includes (i) an electrical contact located on the top side of the second memory mezzanine board and (ii) a memory device coupled to the bottom side of the second memory mezzanine board and electrically coupled to the electrical contact of the second memory mezzanine board;

a first connector to electrically couple the power circuitry devices of the first power mezzanine board to the first processor, wherein the first connector extends through the circuit board substrate to the top and bottom sides thereof, and wherein the first connector comprises (i) a first contact accessible from the top side of the circuit board substrate and electrically connected with the first electrical contact located on the bottom side of the first processor mezzanine board and (ii) a second contact, opposite the first contact, accessible from the bottom side of the circuit board substrate and electrically connected with the electrical contact located on the top side of the first power mezzanine board;

a second connector to electrically couple the memory device of the first memory mezzanine board to the first processor, wherein the second connector extends through the circuit board substrate to the top and bottom sides thereof, and wherein the second connector comprises (i) a first contact accessible from the top side of the circuit board substrate and electrically connected with the second electrical connector located on the bottom side of the first processor mezzanine board and (ii) a second contact, opposite the first contact of the second connector, accessible from the bottom side of the circuit board substrate and electrically connected with the electrical connector located on the top side of the first memory mezzanine board;

a third connector to electrically couple the power circuitry devices of the second power mezzanine board to the second processor, wherein the third connector extends through the circuit board substrate to the top and bottom sides thereof, and wherein the third connector comprises (i) a first contact accessible from the top side of the circuit board substrate and electrically connected with the first electrical contact located on the bottom side of the second processor mezzanine board and (ii) a second contact, opposite the first contact of the third connector, accessible from the bottom side of the circuit board substrate and electrically connected with the electrical contact located on the top side of the second power mezzanine board; and a fourth connector to electrically couple the memory device of the second memory mezzanine board to the second processor, wherein the fourth connector extends through the circuit board substrate to the top and bottom sides thereof, and wherein the fourth connector comprises (i) a first contact accessible from the top side of the circuit board substrate and electrically connected with the second electrical connector located on the bottom side of the second processor mezzanine board and (ii) a second contact, opposite the first contact of the third connector, accessible from the bottom side of the circuit board substrate and electrically connected with the electrical connector located on the top side of the second memory mezzanine board.

* * * * *